(12) United States Patent
Böekling et al.

(10) Patent No.: US 9,910,574 B2
(45) Date of Patent: Mar. 6, 2018

(54) METHOD AND SYSTEM FOR VISUALIZING AND MANIPULATING GRAPHIC CHARTS

(71) Applicant: WHAT-IFOLUTION TECHNOLOGY BV, Breda (NL)

(72) Inventors: Bert Böekling, Heemskerk (NL); Ted Truijens, Breda (NL)

(73) Assignee: What-iFolution Technology BV, Breda (NL)

( * ) Notice: Subject to any disclaimer, the term of this patent is extended or adjusted under 35 U.S.C. 154(b) by 312 days.

(21) Appl. No.: 14/654,462

(22) PCT Filed: Dec. 23, 2013

(86) PCT No.: PCT/EP2013/077931
§ 371 (c)(1),
(2) Date: Jun. 19, 2015

(87) PCT Pub. No.: WO2014/096453
PCT Pub. Date: Jun. 26, 2014

(65) Prior Publication Data
US 2015/0346972 A1    Dec. 3, 2015

(30) Foreign Application Priority Data

Dec. 21, 2012   (WO) .................. PCT/EP2012/076762
Mar. 27, 2013   (WO) .................. PCT/EP2013/056508

(51) Int. Cl.
*G06T 11/20*   (2006.01)
*G06F 3/0484*  (2013.01)
(Continued)

(52) U.S. Cl.
CPC ........ *G06F 3/04845* (2013.01); *G06F 3/0488* (2013.01); *G06F 17/16* (2013.01);
(Continued)

(58) Field of Classification Search
CPC .................. G06T 11/206; G06F 17/30716
See application file for complete search history.

(56) References Cited

U.S. PATENT DOCUMENTS 5,732,158 A * 3/1998 Jaenisch .................. G06T 7/60
358/464
2005/0068320 A1   3/2005 Jaeger
(Continued)

FOREIGN PATENT DOCUMENTS

| EP | 0 561 241 A2 | 9/1993 |
| EP | 0 674 291 A2 | 9/1995 |
| WO | WO 2014/096453 | 6/2014 |

OTHER PUBLICATIONS

International Search Report, Application No. PCT/EP2013/077931, dated Jun. 5, 2014, 4 pgs.
(Continued)

*Primary Examiner* — Phi Hoang
(74) *Attorney, Agent, or Firm* — Knobbe Martens Olson & Bear LLP

(57) ABSTRACT

A method, a computer program product and a server for visualizing and manipulating graphic charts to one or more users is disclosed. The method includes creating n variables, creating multiple datasets including data points representing a relation between a subset of the variables, and creating one or more graphic charts each comprising a representation of the datasets. The method also includes displaying the graphic charts on display elements and manipulating a dataset in a graphic chart where a mathematical model is created and relations between the datasets are detemiined by the mathematic model. The relations operate in a two-way direction, and the datasets and graphic charts are accordingly updated when manipulated.

14 Claims, 24 Drawing Sheets

|   | a   | b   | c   |
|---|-----|-----|-----|
| a |     | b+c | b+c |
| b | a-c |     | a-c |
| c | a-b | a-b |     |

(51) Int. Cl.
*G06F 17/50* (2006.01)
*G06F 17/16* (2006.01)
*G06T 11/60* (2006.01)
*G06F 3/0488* (2013.01)

(52) U.S. Cl.
CPC ........ *G06F 17/5009* (2013.01); *G06T 11/203* (2013.01); *G06T 11/206* (2013.01); *G06T 11/60* (2013.01)

(56) References Cited

U.S. PATENT DOCUMENTS

2007/0067211 A1* 3/2007 Kaplan ................. G06Q 10/04
 705/7.31
2007/0271285 A1 11/2007 Eichorn et al.
2012/0011458 A1 1/2012 Xia et al.
2012/0272186 A1* 10/2012 Kraut ................... G06F 3/0488
 715/810

OTHER PUBLICATIONS

Written Opinion of the International Search Authority, Application No. PCT/EP2013/077931, dated Jun. 5, 2014, 5 pgs.

* cited by examiner

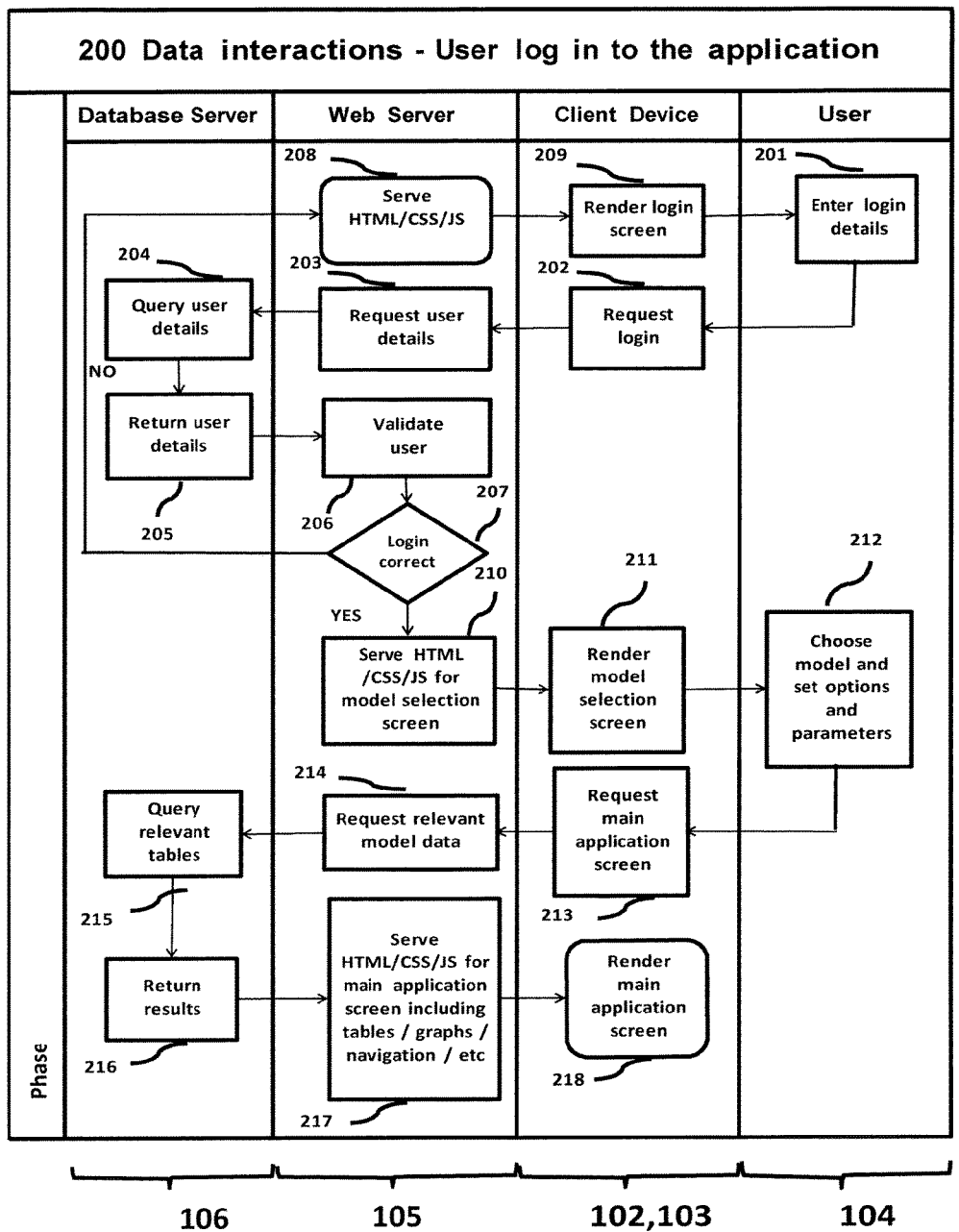
Fig. 2.1

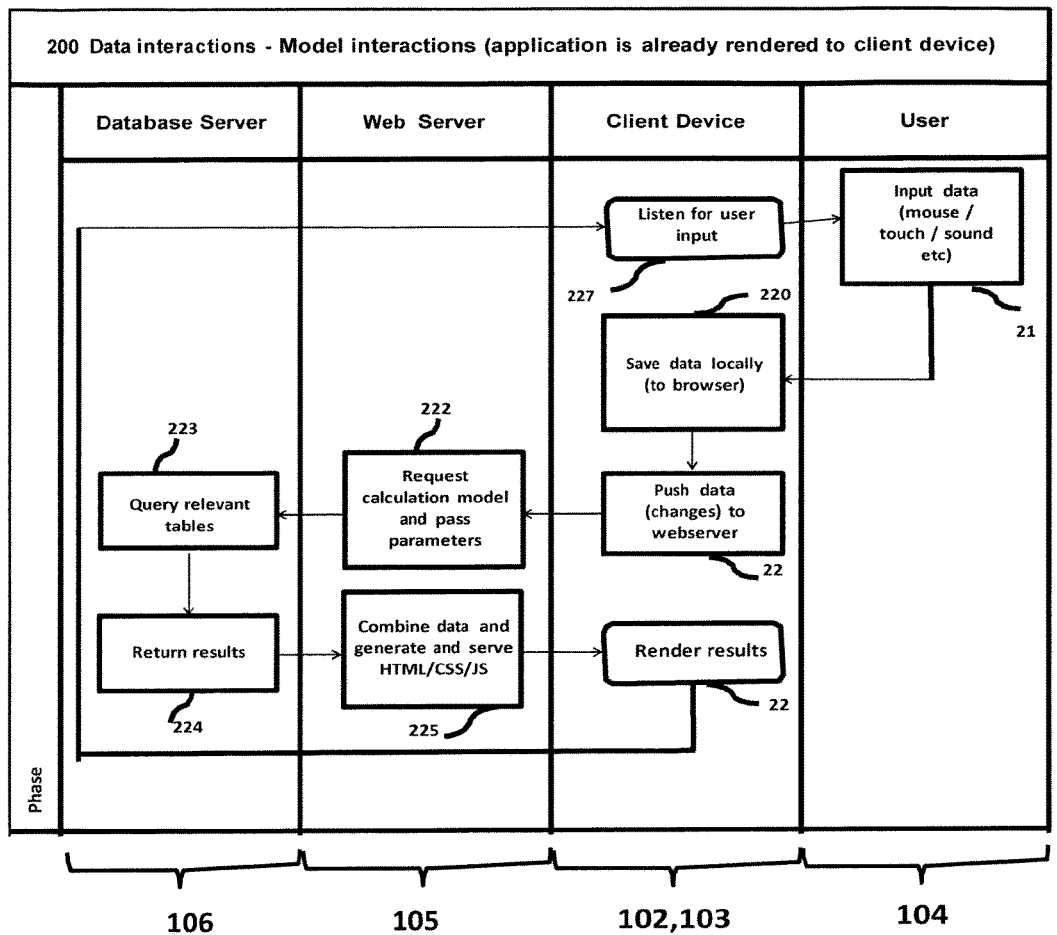
Fig. 2.2

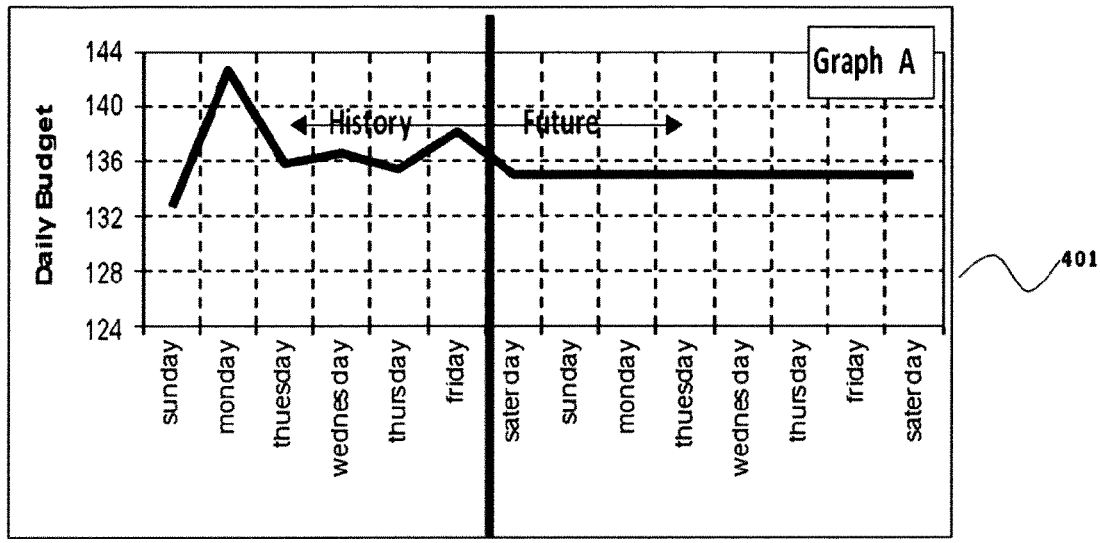
Fig. 5.1
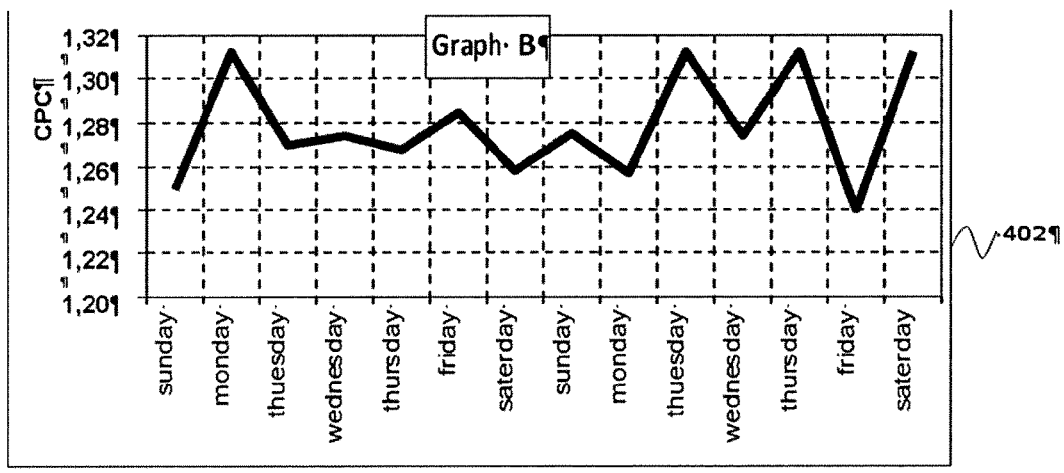
Fig. 5.2

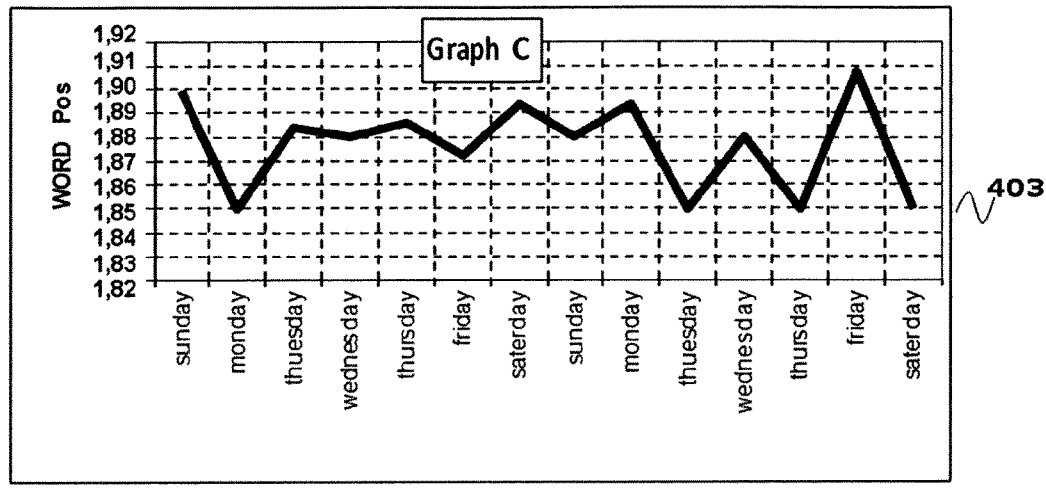
Fig. 5.3
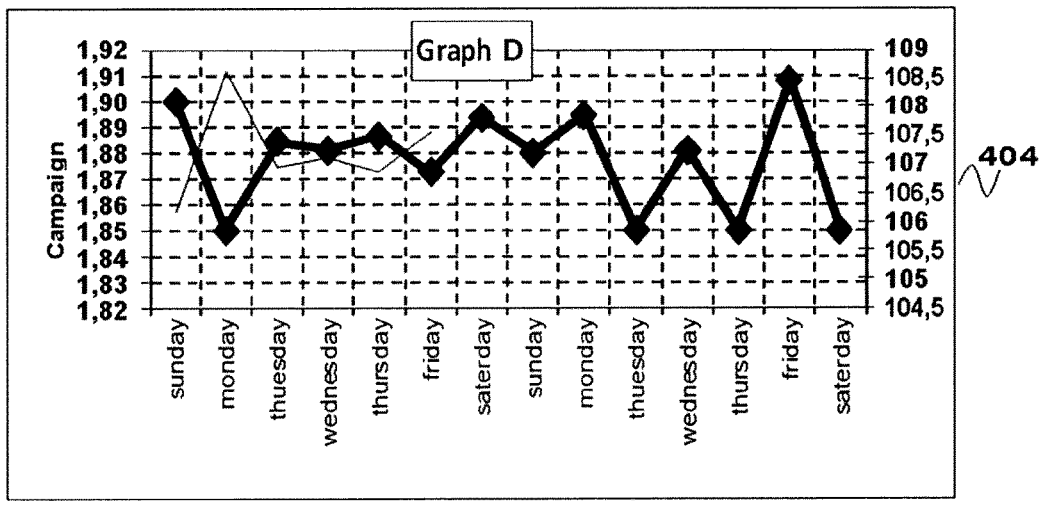
Fig. 5.4

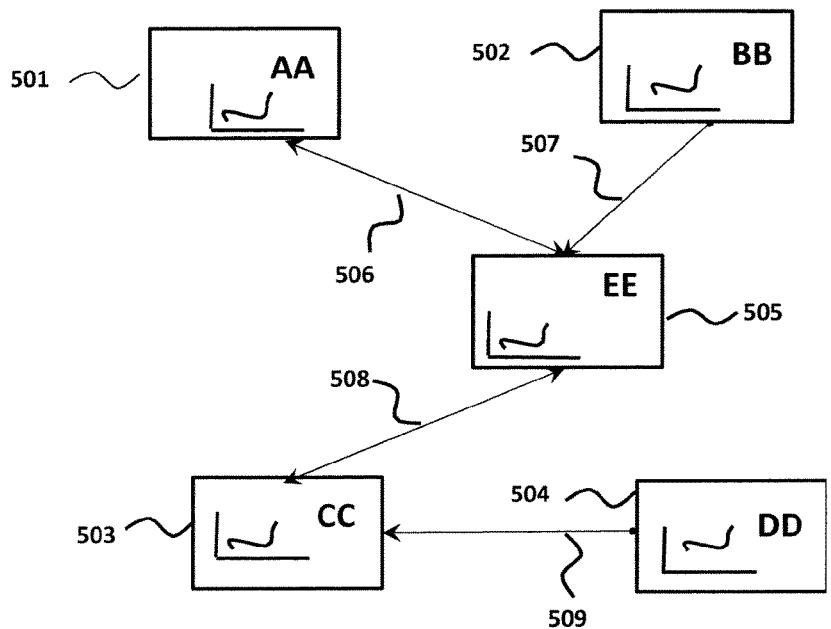
Fig. 6
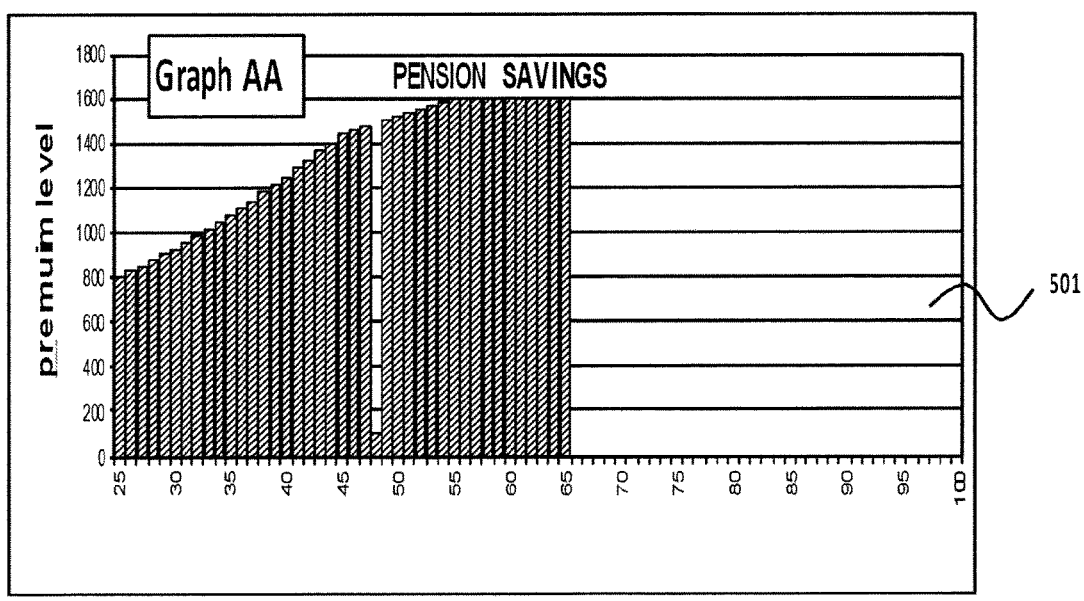
Fig. 7.1

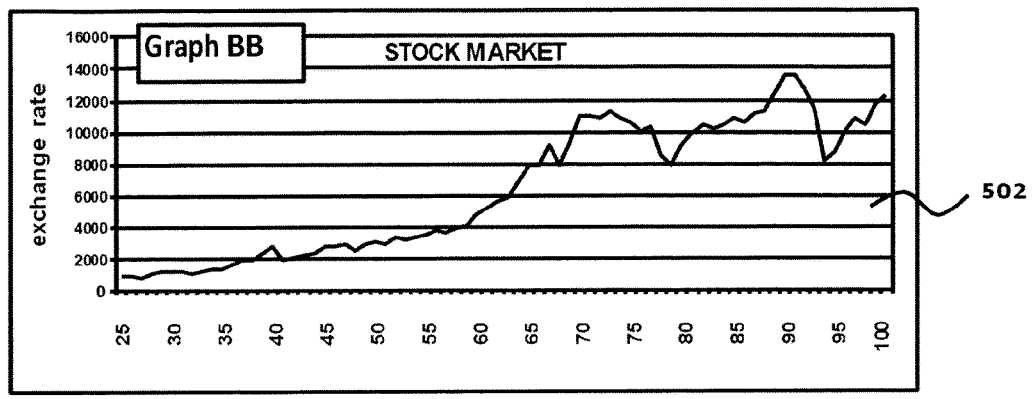
Fig. 7.2
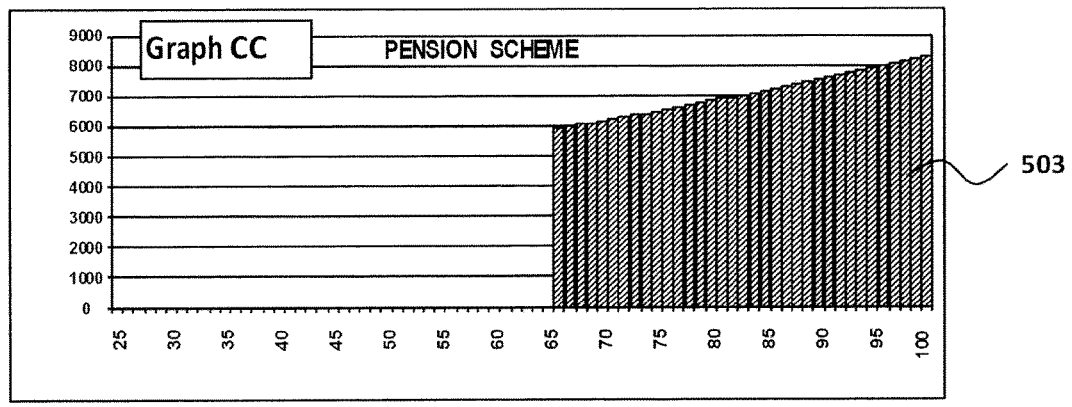
Fig. 7.3

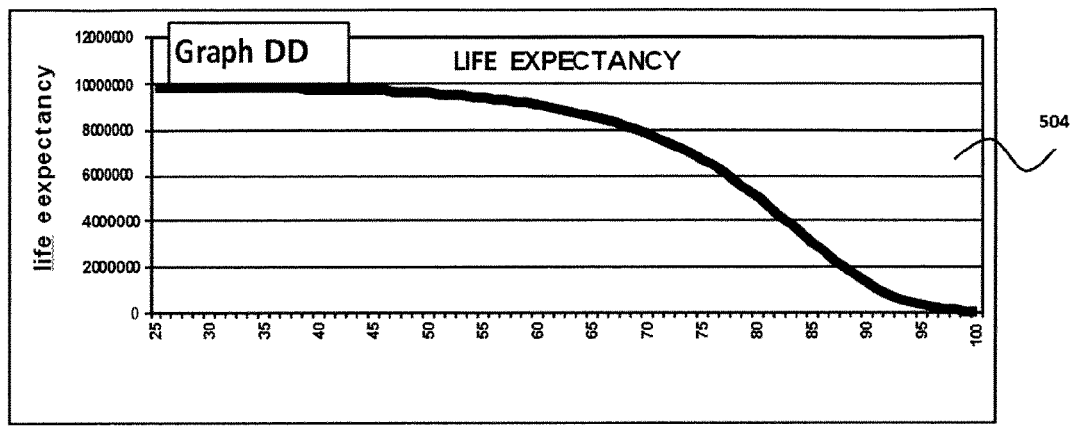
Fig. 7.4
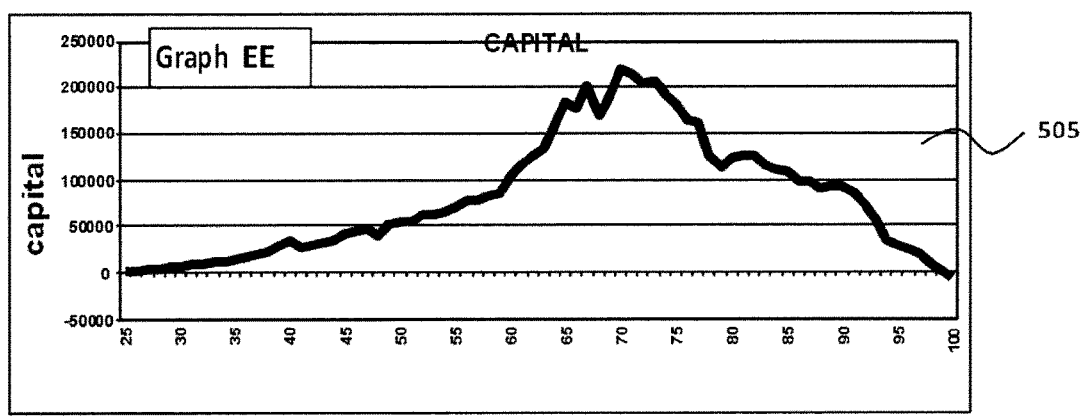
Fig. 7.5

|   | a | b | c |
|---|---|---|---|
| a |   | b+c | b+c |
| b | a-c |   | a-c |
| c | a-b | a-b |   |

Fig. 9

|   | a | b | c |
|---|---|---|---|
| a |   | c/(1-b) | c/(1-b) |
| b | 1-c/a |   | 1-c/a |
| c | c=a(1-b) | c=a(1-b) |   |

Fig. 10

|   | a | b | c |
|---|---|---|---|
| a |   | c/(1-b) | c/(1-b) |

Fig. 11

|   | parameter 1 | parameter 2 | parameter 3 |
|---|---|---|---|
| parameter 1 |   | P1=P2+P3 | P1=P3+P2 |
| parameter 2 | P2=P1-P3 |   | P2=-P3+P1 |
| parameter 3 | P3=P1-P2 | P3=-P2+P1 |   |

Fig. 12

|    | P1 | P2 | P3 |
|----|----|----|----|
| P1 | x | P1 is function of P2, P3 supposed to be a constant | P1 is function of P3, P2 supposed to be a constant |
| P2 | P2 is function of P1, P3 supposed to be a constant | x | P2 is function of P3, P1 supposed to be a constant |
| P3 | P3 is function of P1, P2 supposed to be a constant | P3 is function of P2, P1 supposed to be a constant | x |

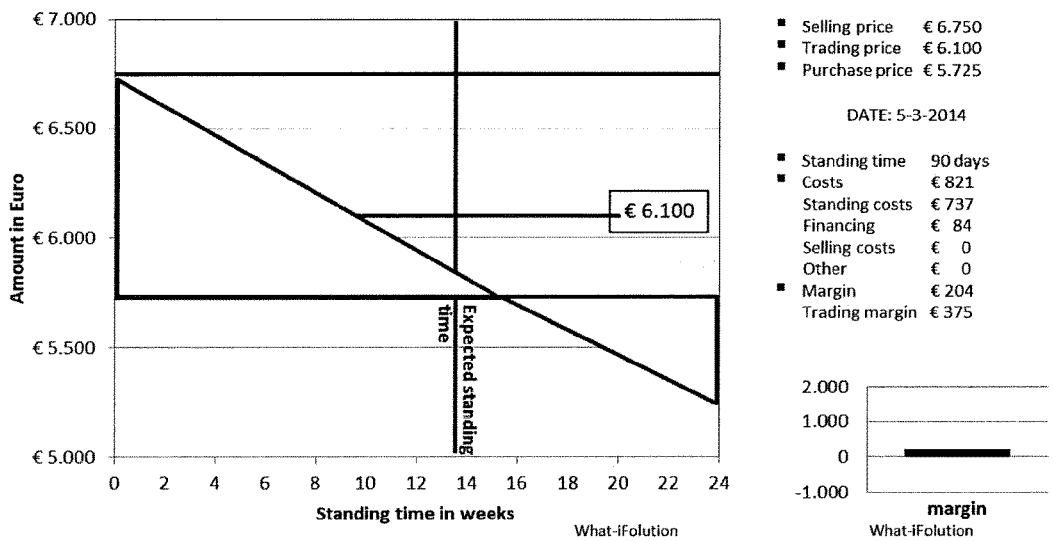
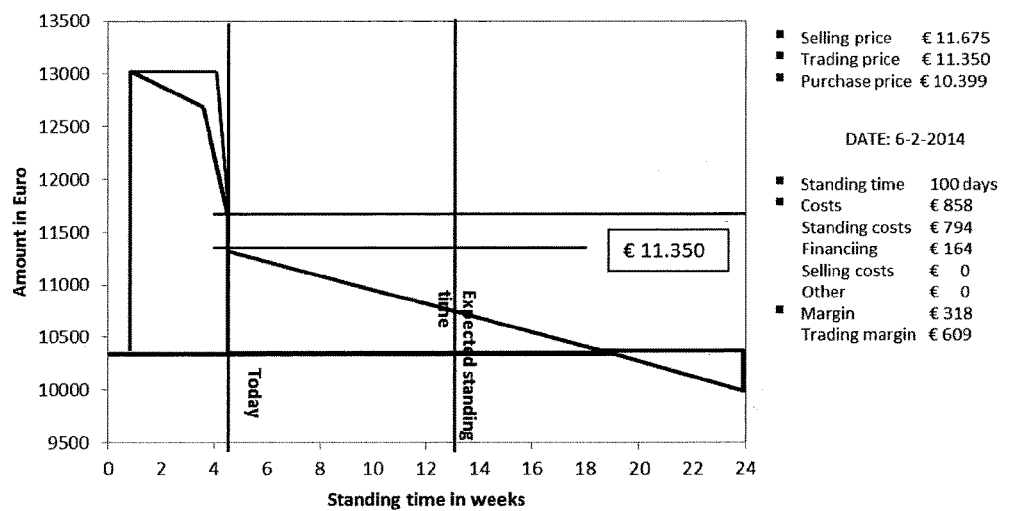
Fig. 27

METHOD AND SYSTEM FOR VISUALIZING AND MANIPULATING GRAPHIC CHARTS

RELATED APPLICATIONS

This application is the U.S. National Phase of Application No. PCT/EP2013/077931, entitled "Method and System for Visualizing and Manipulating Graphic Charts", filed on Dec. 23, 2013, which designates the U.S., and which claims the benefit of priority of Application No. PCT/EP2012/076762, filed on Dec. 21, 2012, and Application No. PCT/EP2013/056508 filed on Mar. 27, 2013, the entirety of which all are hereby incorporated by reference.

FIELD OF INVENTION

The invention disclosed herein relates, in general, to visualizing and manipulating graphic charts. More specifically, the present invention relates to a method, a computer program product and a server for visualizing graphic charts and for manipulating these charts by one or more users.

BACKGROUND

Graphics are an extremely effective way to communicate information, and a variety of graphical charts have been developed to visualize data. Some of the more popular graphic chart types are pie charts, vertical bar charts, horizontal bar charts, data plot charts, line trend charts, bubble charts, and so on. Each of these chart types displays data in a different manner in an attempt to improve data visualization and user recognition of data relationships. Such graphical charts have been adopted by many different software systems that deal with data visualization.

Graphic charts are means to visually present categorical numeric values or data sets so that ratios and other relationships between them can easily be determined. Graphic charts are typically generated using computer spreadsheet programs where data sets are entered into an electronic spreadsheet of a computer spreadsheet program. The generated graphic chart can be modified by changing the information contained in the spreadsheet.

Document U.S. 2005/0068320A1 discloses a method for creating and manipulating graphic charts, involving displaying graphic control devices that are controllable by user to change numeric values of devices, and displaying chart components to create graphic chart. The method involves displaying graphic control devices e.g. faders, that are controllable by a user to change numeric values of the devices. The devices are related to a graphic chart, to be created so that the values correspond to chart components of the chart. The chart components are displayed to create the graphic chart. The displayed chart components visually represent the numeric values.

However, there is a need of a better visualization of multiple graphic charts for data analysis. Data visualization should be more interactive. A user should be able to more easily create and modify the numeric values or data sets of graphic charts.

An additional concern is that it can be difficult for the user to recognize relationships between the data represented by the charts in real-time. Eventhough large data sets are provided to be analyzed. Visualizing graphic charts should be more transparent, clear and quicker interpretable. At the same time the visualizing display area should be more compact.

Another concern is that qualitatively analyzing graphic charts should take less time. A user should not switch back and forth repeatedly between different menu entries, tabs or windows in computer programs to create or manipulate data sets of graph charts.

In light of the above discussion, there is required a system and method that overcomes at least one or more of the above mentioned drawbacks in the prior art.

SUMMARY

In a first aspect, the invention concerns a method for visualizing graphic charts to one or more users, the method comprising:
  creating n variables, wherein n is three or more;
  creating multiple datasets, comprising data points representing a relation between a subset of said variables;
  creating one or more graphic charts each comprising a representation of one or more of said datasets;
  displaying said graphic charts on one or more display elements;
  manipulating a dataset in a graphic chart,
  wherein a mathematical model is created, said relations between said datasets are determined by said mathematic model, said relations work in a 2 way direction and said datasets and graphic charts are accordingly updated when manipulated.

It is advantageous that by manipulating a dataset in a graphic chart, all other datasets will be recalculated according to the mathematical model. The datasets and graphic charts will be directly updated. To manipulate graph charts it suffices to manipulate the datasets represented in the graph charts, whereby this manipulation will directly update all other represented datasets in the graph charts. The datasets are created and modified with in the graphic charts themselves. This is more user friendly. Also, this leads to more transparent, clear, less complex, more compact graphic charts. Therefore, analyzing or interpreting the data takes less time. It allows users to more quickly predict or interpret data, e.g. with what-if analyses.

An embodiment of the invention includes a computer program product using a computing device connected to a server via a network, the computer program product comprising at least one computer-readable storage medium having computer-readable program code portions stored therein, the computer-readable program code portions comprising instructions to perform method steps for visualizing graphic charts and for manipulating these charts by one or more users.

Another embodiment of the invention includes a database server using a computing device connected to the server via a network, the server comprising at least one processor, the at least one processor configured to perform method steps for visualizing graphic charts and for manipulating these charts by one or more users.

BRIEF DESCRIPTION OF FIGURES

FIG. 2.1 is a swimlane flowchart illustrating an exemplary method of a user log in to the application, in accordance with an embodiment of the present invention.

FIG. 2.2 is a swimlane flowchart illustrating an exemplary method of data interaction of the application, in accordance with an embodiment of the present invention.

FIG. 5 (i.e. FIGS. 5.1 to 5.4) is an overview of exemplary graph charts, in accordance with an embodiment of the present invention.

FIG. 6 is a diagrammatic illustration of an exemplary method of visualizing and manipulating graphic charts, in accordance with an embodiment of the present invention.

FIG. 7 (i.e. FIGS. 7.1 to 7.5) is an overview of exemplary graph charts, in accordance with an embodiment of the present invention.

FIG. 9 is a schematic illustration of a matrix model, in accordance with an embodiment of the present invention.

FIG. 10 is a schematic illustration of a matrix model, in accordance with an embodiment of the present invention.

FIG. 11 is a schematic illustration of part of the matrix model in FIG. 10.

FIG. 12 is a schematic illustration of a matrix model, in accordance with an embodiment of the present invention.

FIGS. 19 to 27 are illustrative screenshots of a graphical user interface, in accordance with embodiments of the present invention.

Figure 1:
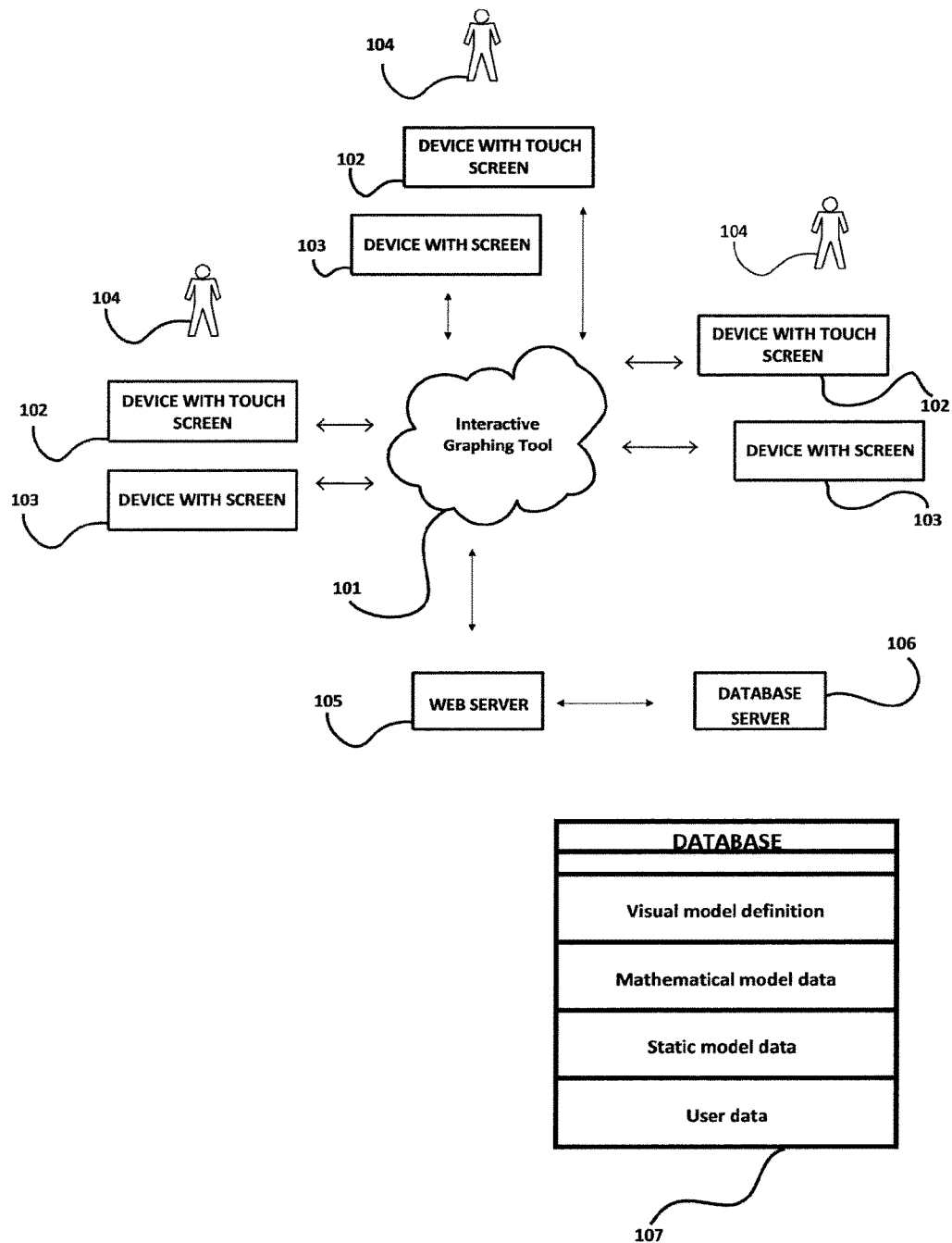
FIG. 1 is a schematic illustration of an environment required for functioning of the present invention, in accordance with an embodiment of the present invention.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the present invention.

There may be additional structures described in the foregoing application that are not depicted on one of the described drawings. In the event such a structure is described, but not depicted in a drawing, the absence of such a drawing should not be considered as an omission of such design from the specification.

DETAILED DESCRIPTION OF THE INVENTION

Before describing the present invention in detail, it should be observed that the present invention utilizes apparatus components and method steps to describe systems and methods for visualizing graphic charts and for manipulating these charts by one or more users. Accordingly, the apparatus components and the method steps have been represented, wherever appropriate, by conventional symbols in the drawings, showing specific details that are pertinent for an understanding of the present invention. Only the specific details are shown so as not to obscure the disclosure with details that will be readily apparent to those with an ordinary skill in the art having the benefit of the description herein.

While the specification concludes with the claims defining the features of the present invention that are regarded as novel, it is believed that the present invention will be better understood from a consideration of the following description in conjunction with the drawings, in which like reference numerals are carried forward.

As required, detailed embodiments of the present invention are disclosed herein; however, it is to be understood that the disclosed embodiments are merely exemplary of the present invention, which can be embodied in various forms. Therefore, specific structural and functional details disclosed herein are not to be interpreted as limiting, but merely as a basis for the claims and as a representative basis for teaching one skilled in the art to employ variously the present invention in virtually any appropriately detailed structure. Further, the terms and phrases used herein are not intended to be limiting, rather they provide a better understanding of the description of the present invention.

The terms "a" or "an", as used herein, are defined as one or more than one. The term "another", as used herein, is defined as at least a second or more.

In a first aspect, the invention concerns a method for visualizing graphic charts to one or more users, the method comprising:
  creating n variables, wherein n is three or more;
  creating multiple datasets, comprising data points representing a relation between a subset of said variables;
  creating one or more graphic charts each comprising a representation of one or more of said datasets;
  displaying said graphic charts on one or more display elements;
  manipulating a dataset in a graphic chart,
wherein a mathematical model is created, said relations between said datasets are determined by said mathematic model, said relations work in a 2 way direction and said datasets and graphic charts are accordingly updated when manipulated.

It is advantageous that by manipulating a dataset in a graphic chart, all other datasets will be recalculated according to the mathematical model. The datasets and graphic charts will be directly updated. To manipulate graph charts it suffices to manipulate the datasets represented in the graph charts, whereby this manipulation will directly update all other represented datasets in the graph charts. The datasets are created and modified with in the graphic charts themselves. This is more user friendly. Also, this leads to more transparent, clear, less complex, more compact graphic charts. Therefore, analyzing or interpreting the data takes less time. It allows users to more quickly predict or interpret data, e.g. with what-if analyses.

An embodiment of the invention includes a computer program product using a computing device connected to a server via a network, the computer program product comprising at least one computer-readable storage medium having computer-readable program code portions stored therein, the computer-readable program code portions comprising instructions to perform method steps for visualizing graphic charts and for manipulating these charts by one or more users.

Another embodiment of the invention includes a database server using a computing device connected to the server via a network, the server comprising at least one processor, the at least one processor configured to perform method steps for visualizing graphic charts and for manipulating these charts by one or more users.

In a preferred embodiment of the invention, said mathematical model is a matrix model, comprising singular variable expressions.

The term "singular" as used in underlying invention is to be interpreted as that a relationship is able to be expressed or written unambiguously as a single or singular variable, not being nested.

The term "matrix model" as used in underlying invention is to be interpreted as a mathematical model that can be written as a matrix wherein the elements correspond to mathematical expressions, preferably singular expressions, as a function of input variables.

In a preferred embodiment of the invention updating a dataset corresponding to a variable is calculated by fixing values of variables other than said to be updated variable and a variable, which is being manipulated.

The term "fixing" as used in underlying invention is to be interpreted as determining and/or keeping a mathematical fixed value for a variable during a manipulating action.

The terms "variable" and "parameter" as used in underlying invention are to be interpreted as synonyms.

In a preferred embodiment of the invention, the method further comprises adding or deleting a dataset. This allows a user to dynamically change and modify datasets form graph charts.

In a preferred embodiment, creating or adding a dataset, comprises drawing a line on a displayed graphic chart by touch, mouse, sound, gestures or speech. This allows the user a more user friendly and quicker way of creating or adding datasets.

In a preferred embodiment, said mathematic model meets the following requirements:
  v conditions are imposed between said n variables;
  (n-v) is the maximum amount of free variables;
  any of said (n-v) free variables can be chosen out of said n variables;
  and the other v variables can be calculated on a 1-to-1 correspondence according the v conditions.

With the term "free variable", it is meant that in said mathematical model, a maximum number of free variables can be freely chosen at the same time independently from the other variables. In an exemplary embodiment, said mathematical model is a linear model of n variables, where it is known that v linear independent conditions give rise to (n-v) free variables.

In a preferred embodiment, each data set of a graphic chart represents a relation between two variables. It is advantageous as two-dimensional charts are common and easy and quickly interpretable.

In a preferred embodiment, a dataset in a graphic chart is manipulated by moving a data point of a graphic chart to a desired position on said graphic chart by touch, mouse, sound, gestures or speech. This allows the user to manipulate graph charts in an easier, more user friendly, quicker and simpler way.

In a preferred embodiment, nearby data points of said manipulated data point are manipulated by an extrapolation method. A multiple of datapoints, by preference neighbouring datapoints, can be manipulated at once.

In a preferred embodiment, one or more datasets in a graphic chart are manipulated by a multi-touch operation. A multiple of datasets or datapoints can be manipulated at once. This allows for a faster and more user friendly manipulation of datasets of graph charts.

In a preferred embodiment, a display element is provided by a computing device which is connected to a database server via a network.

In a more preferred embodiment, a display element consists of an area on a screen of said computing device. It is advantageous as multiple users can view and/or manipulate remotely, in any place and at the same time. This increases user comfort and decreases analysis time.

In an even more preferred embodiment, two or more display elements are displayed on said screen. This allows for a user to get a better overview on all variables and relations between them.

In a second aspect, the invention concerns a computer program product for visualizing graphic charts to one or more users using a computing device connected to a server via a network, the computer program product comprising at least one computer-readable storage medium having computer-readable program code portions stored therein, the computer-readable program code portions comprising instructions for:
  creating n variables, wherein n is three or more;
  creating multiple datasets, comprising data points representing a relation between a subset of said variables;
  creating one or more graphic charts each comprising a representation of one or more of said datasets;
  displaying said graphic charts on one or more display elements;
  manipulating a dataset in a graphic chart,
wherein a mathematical model is created, said relations between said datasets are determined by said mathematic model, said relations work in a 2 way direction and said datasets and graphic charts are accordingly updated when manipulated.

In a third aspect, the invention concerns a database server using a computing device connected to the server via a network, the server comprising at least one processor, the at least one processor configured to perform method steps for visualizing graphic charts and for manipulating these charts by one or more users.

Figure Description

The following description refers to the figures presented earlier in this document. This description does not limit the invention. Instead, the scope of the invention is defined by the appended claims and equivalents.

FIG. 1 schematically shows an environment required for functioning of the present invention in accordance with an embodiment of the present invention. The highest level is illustrated (i.e. the least level of detail). The interactive graphing tool (101) can be accessed by multiple users (104), simultaneously and independently through a computer (103) or a touch device (102), like a tablet. Users access the tool over a network, like an intranet or the internet. The tool is presented to the user in a browser, which is a standalone browser or one integrated into the device. The browser preferably is Javascript enabled to be able to work with the invention. The tool is preferably built of HTML and Javascript, served by a webserver (105). The webserver accesses a database server (106) which can be on the same physical server or in the cloud. The database server delivers data for the application from a database (107).

FIGS. 2.1 and 2.2 show swimlane flowcharts illustrating the data exchange between the database server (106), web server (105) and client device (102, 103) initiated by a user (104). Each vertical swimlane represents an actor in the model. The communication between these actors are illustrated. FIG. 2.1 illustrates an exemplary method of a user log in to the application, in accordance with an embodiment of the present invention. The upper part of the flowchart of FIG. 2.1, including the 'login correct' decision, shows a relative standard login process. When the user has successfully authenticated himself, he is presented a screen in which he can choose a model to use. The HTML ("hypertext markup language"), CSS ("cascading style sheets") and JS ("Javascript") is served to the client device by the webserver. The client device renders this information to the screen.

FIG. 2.2 illustrates an exemplary method of data interaction of the application, in accordance with an embodiment of the present invention. It shows the data flows of model interactions caused by the user. The user is able to draw data with his input device (e.g. IE mouse, finger(s), sound, gestures). This data can be a single point that is inserted, changed or deleted, or a series of points at once. The client devices registers this input and pushes this data (via e.g. AJAX, Asynchornous Javascript And XML) to the webserver. The webserver in turn will request data from the database server to calculate changes to the model and then combines this data, generates updated HTML/CSS/JS and serves this to the client as a response to the original AJAX request. The client device renders this updated data (HTML/CSS/JS) to the screen.

Figure 3:
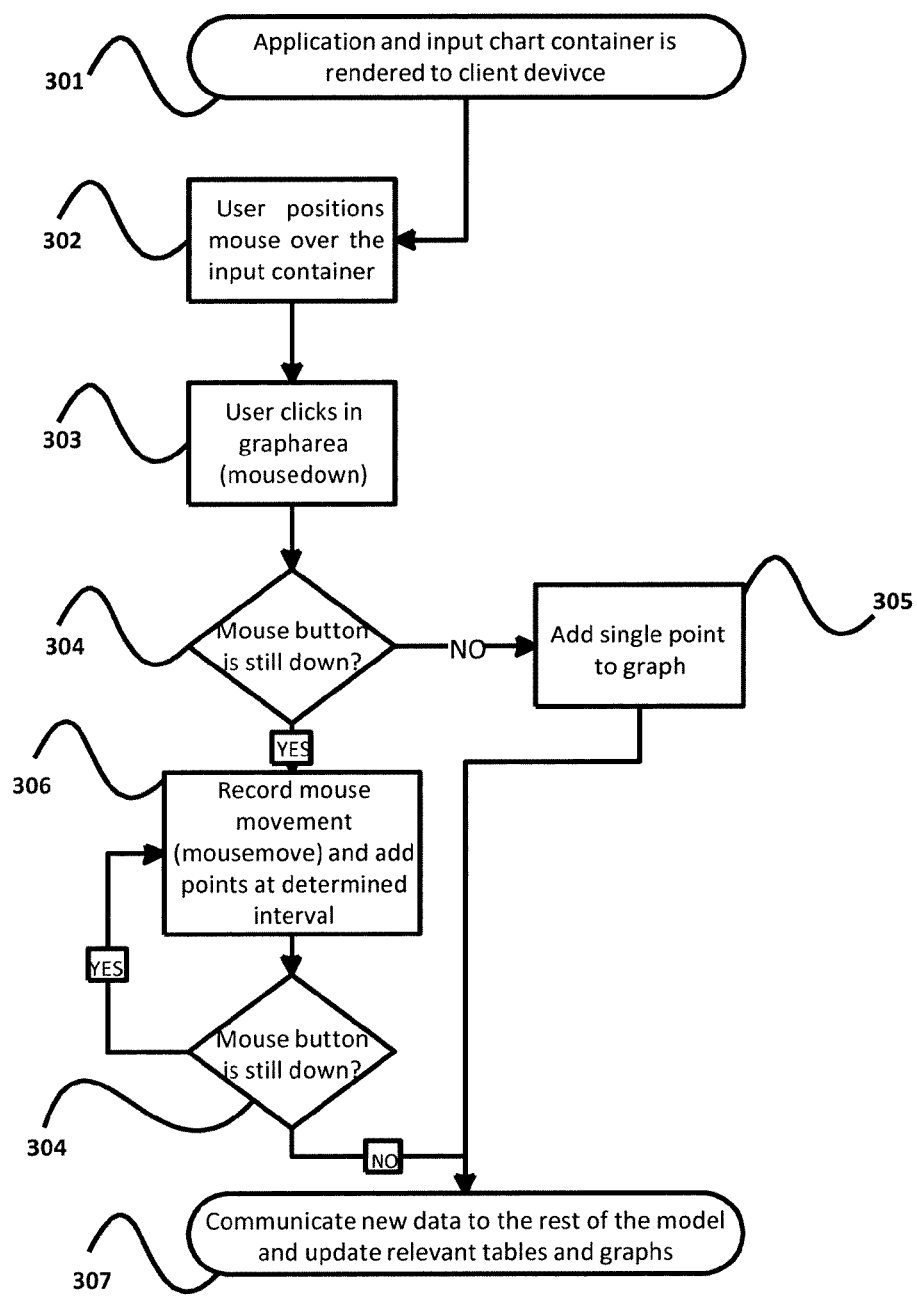
FIG. 3 is a flowchart illustrating an exemplary method of drawing a dataset in a graph chart, in accordance with an embodiment of the present invention.

FIG. 3 is a flowchart illustrating an exemplary method of drawing a dataset in a graph chart, in accordance with an embodiment of the present invention. Once the application is rendered to the client devices' screen (301), the application is ready to receive mouse and/or touch events. In this process we explain how a user can enter data in the graph area by using his input device. Once the mouse cursor is positioned over the area where the graph can be drawn (302), the application triggers a process once the user clicks (303) the primary mouse button. This action can also be performed on a touch device by touching (touchstart event) the screen in the same area (303). The application calculates the x and y values for the axis relative to the clicked (or touched) position. If the mouse button is released, without moving at least 1 step on the x axis, a single point is entered en visualised in the graph (304 and 305). Related data, tables and graphs in the application are immediately updated (307). If the mouse button is not released, but instead the user moves the cursor, new x and y values for the current position are calculated and entered into the graph area (306). This action is terminated when all possible points on the x axis are entered or when the mouse button is released (mouseup or touchend event). Again all related data, tables and graphs in the application are immediately updated (307).

EXAMPLE 1

A first example to illustrate an embodiment of the invention, concerns a template for an advertisement model.

In prior art an advertisement model such as Google Adwords (GA) is known. GA is using different parameters to calculate the cost for a campaign. By making a combination of statistics, the history, auctions and other parameters they are able to offer advertisements who are reasonable in price and who are effective. The price can also vary in price depending the demand of the market, the behavior of the visitors, etc. This model for the users is still very complex en not really user friendly. Their advertisement template is built in a very static way and cannot called interactive. The services gives feedback or provided extra information so you can determine which kind of campaign would give you the highest ROI ("return on investment"), but this is always a one way direction. If the user wants to adjust their campaign they have to follow it carefully. There is not an easy and certainly not an interactive way to do this.

Figure 4:
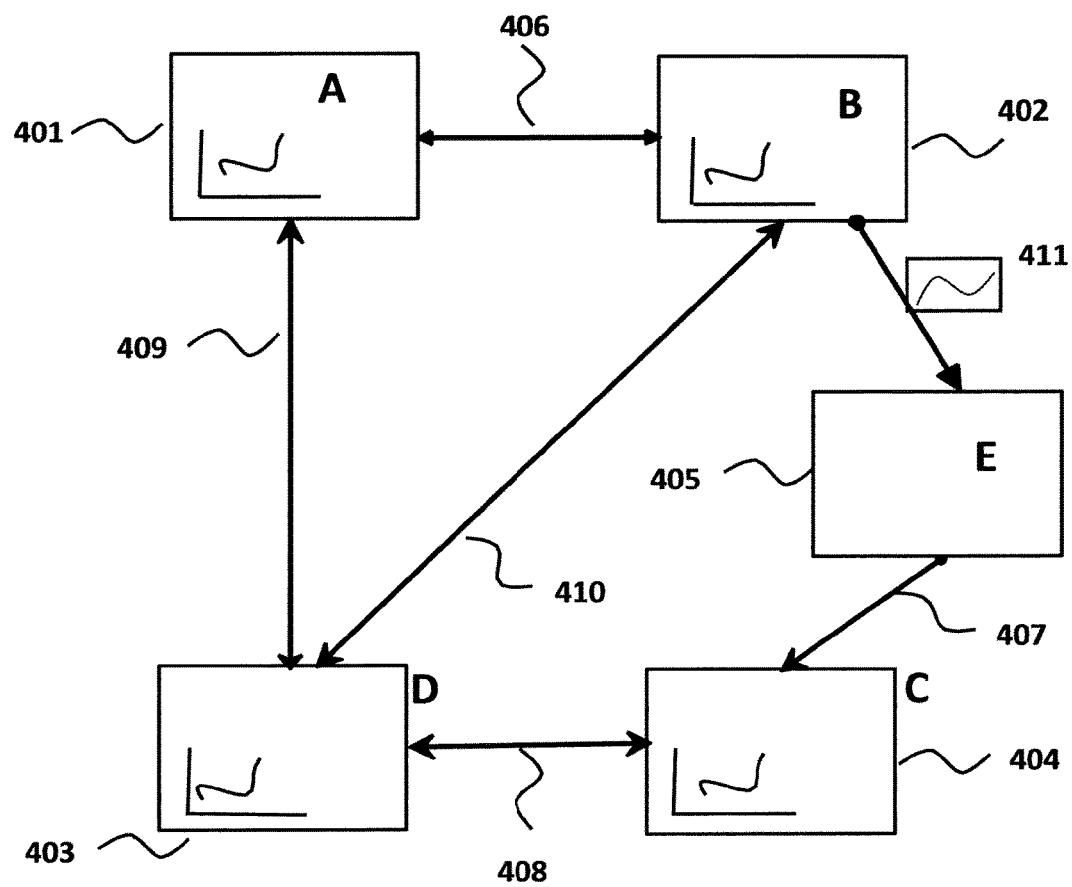
FIG. 4 is a diagrammatic illustration of an exemplary method of visualizing and manipulating graphic charts, in accordance with an embodiment of the present invention.

The invention offers a possible solution for the lack of interactivity that is inherent on the present system used by the GA model. This example uses graphic charts that represent the different values and make them interactive to each other. If you change a value in one graphic chart or table the values in the other graphic charts or tables adjust their values accordingly. This works in a 2 way direction. The example that we use is a simplified advertisement model of an adword like system. The advertisement model uses 3 variables as basis for the advertisement campaign: budget, CPC ("cost per click") and word position. FIG. 4 is a diagrammatic illustration of the exemplary advertisement model for visualizing and manipulating graphic charts, in accordance with an embodiment of the present invention. FIG. 5 shows an overview of graph charts, in accordance with the diagrammatic illustration.

Graphic chart A (401) shows:
x-axis days of the week
y-axis daily budget
black line is daily budget
Graphic chart B (402) shows:
x-axis days of the week
y-axis is CPC value
black line is CPC for specific word choice/combination
the relation between CPC and Word Position is generated by historical statistics.
Graphic chart C (403) shows:
x-axis days of the week
y-axis word position
black line is Word Position for specific word choice/combination
the Word position is depending of the CPC
the Word Position decreases if the budget is exceeded
Graphic chart D (404) shows:
x-axis days of the week
y-axis daily budget
black line is campaign line
dashed line is daily Clicks for specific word choice/combination or the analytics of the history
Graphic Chart A (401): Daily Budget (See FIG. 5.1)

E.g. the users want to spent 300 USD over a period of 30 days, the monthly budget is spread equally per day. In this example this equals 10 USD per day. After the monthly and therefore the daily budget has been set, it can be modified per day by manipulation the line of the graphic chart by finger or mouse. The values after the point of manipulation will be adjusted accordingly. If the values are being raised in such a way that the maximum budget is reached before the end of the period (30 day's) the max value of raising is limited to a value that is a summation of the daily budgets on this day and before. The result is that the days after which the maximum has been reached the daily budget is set on zero.

Graphic Chart B (402): CPC (Cost Per Click) (See FIG. 5.2)

This determines the cost per click of the advertisement itself.

The cost of the advertisement has been determined by things such as the position (on top, as a banner, etc) and the position compared to the other advertisers. If the CPC is e.g. 1 USD per click the daily budget gets reduced by 1 USD every 5 times a viewer clicks on the advertisement. In this example the number of possible clicks on the advertisement is max 10 per day. If the CPC is raised to 2 USD, only 5 clicks per day are possible for the advertisement.

Graphic Chart C (403): Word Position (See FIG. 5.3)

This chart shows the position of the word in the results list of the search engine. This is the result of module 405. The influence of the budget is limited to the fact that the influence of the CPC and the auction stops from the moment the budget for that day is completely consumed.

Graphic Chart D (404): Campaign Line (See FIG. 5.4)

This is the average of graphic charts A, B and C. In the same graphic chart (404) a second line is integrated that represents the analytics of the previous days. This is an historical viewers line only and therefore a static line that cannot be manipulated.

By manipulating the campaign line one of the other 2 graphic charts will be manipulated according to user preference (only Graphic chart A (401) or only graphic chart B (402) or both.

If the campaign line has been raised and graphic chart A (401) is selected this means that only the daily limits are being raised for the days that the campaign line has been raised accordingly. In this case it's been programmed that the total budget will be raised in the same proportion as the total adjustment. E.g. if the budget line has been raised under influence of the campaign line 2 days in a row for a total of 10 USD the total budget will be raised with 10 USD. In this case the total budget will be raised up to 310 USD. The campaign line can be lowered again to the original value of 30 by manipulating the line in graphic chart A (401). In case the preference has been set for the budget to be locked this means that graphic chart B (402) will be adjusted if the campaign line is manipulated. If in this case the campaign line has been raised this means that only the value of the CPC's is being raised for the days that the campaign line has been raised accordingly. The result is that number of possible clicks is reduced for the same budget. Within this example the present day is Saturday. All info before this day cannot be adjusted any more. All info on this day and for days after can be manipulated. This applies to all involved graphic charts. In this model the line in graphic chart C is the result of the calculation of module (405). This module is a combination of a calculator, database and auction. This module receives information from graphic chart B in one way in combination with the basic settings of the campaign. The model's output provides the information for graphic chart C (403).

The variables comprise:
A=Budget (401)
B=Max CPC (402)
C =Clicks (403)
D=Word Position (404)
E=Conversion P. Click/Roi (405)
Conditions of the mathematical model comprise:
(406) If the budget is zero no CPC is given
   Budget=Click×Max CPC (by estimate)
   Click is a historical element
(407) Estimated Word Position, given CPC
(408) Given Word Position, Conversion per Click is generated
   Campaign result versus forecast, budget or CPC can be changed
(409) Campaign budget limits the ROI
(410) Campaign budget multiplied by clicks is limited budget
(411) a given CPC estimates the probability of the Word Position (C') given the word history and statistics The advantage of this model compared to systems such as adwords is the interactivity and simplicity for the users. If graphic chart D is shown on a portal site the user can evaluate and modify his campaign in real time. If the user wants to adjust his campaign in detail he can manipulate the graphic charts A, B and C individually e.g. after login.

Note that the (any) model can be expanded with more parameters (variables). The data (CPC, Clicks, Position, CTR etc . . . ) for the campaign related keywords can also obtained from any database, private and other, which is filled with data from historical campaign data. The data can expanded with the data of related sales numbers. Then the relation can be made with sales and CPC. The relation between Sales and campaign Budget (CPC×Clicks) is one kind of ROI than can be added. Another kind of ROI involves the relationship between the visiting ratio and the buyers ratio. Just by representing the ROI as a new variable, the optimization can enlarged. The 2-way technique can be applied and optimization can easily done.

EXAMPLE 2

A second example to illustrate an embodiment of the invention, concerns a retirement planning model for the financial service sector.

Retirement planning is complex, as there is frequent interaction between multiple factors, such as investments, life expectancy, savings, retirement payments, and capital gains. Through careful planning, capital gains are built up over a number of years (normally during years of employment) sufficiently enough to allow for ongoing (monthly) payments during the years of retirement.

FIG. 6 is a diagrammatic illustration of the exemplary retirement planning model for visualizing and manipulating graphic charts, in accordance with an embodiment of the present invention. FIG. 7 shows an overview of graph charts, in accordance with the diagrammatic illustration.

FIG. 6 shows the relationship between the main factors or variables. These variables are:
AA (501)=Annual Savings
BB (502)=Stock Prices
CC (503)=Annual pension premium payment
DD (504)=Life Expectancy (Male)
EE (505)=Pension Capital/Return on Investment All variables AA (501), BB (502), CC (503), and DD (504) have a relation with EE (505). This means that any change in any of these variables impacts EE (505). Optimizing EE (505) as part of retirement planning can be done by changing either AA (501), BB (502), CC (503), DD (504) or any combination. Modifying EE (505) (505) is possible, however a choice must be made to what extend one or more of the other variables will be adjusted. When using retirement planning model, the user can select which variables need to be displayed in a graph. Once these graphs have been set up in the screen, the user can start to optimize retirement planning.

Graph AA (501): Annual Savings. (See FIG. 7.1)

The user can reflect his assumption on the level of (annual) premium to be paid by one stroke with the mouse or finger movement in the graph. By a simple movement of the mouse or finger the premium can be set first time (from scratch) or later adjusted in either one direction, up or down, or backwards or forwards. Any change in AA (501) automatically impacts EE (505) and as such this is directly reflected in graph EE (505).

Graph BB (502): Stock Prices. (See FIG. 7.2)

The user can reflect his assumption on the level of (annual) stock price fluctuations by one stroke with the mouse or finger movement in the graph. By a simple movement of the mouse or finger the premium can be set first time (from scratch) or later adjusted in either one direction, up or down, or backwards or forwards. Any change in BB (502) automatically impacts EE (505) and as such this is directly reflected in graph EE (505).

Graph CC (503): Annual pension payment. (See FIG. 7.3)

The user can reflect the level of annual pension premium to be paid by one stroke with the mouse or finger movement in the graph. By a simple movement of the mouse or finger the payments can be set first time (from scratch) or later adjusted in either one direction, up or down, or backwards or forwards. Any change in CC (503) automatically impacts EE (505) and as such this is directly reflected in graph EE (505).

Graph DD (504): Life Expectancy (Male). (See FIG. 7.4)

The user can reflect the level of mortality by one stroke with the mouse or finger movement in the graph. By a simple movement of the mouse or finger the Life Expectancy (mortality) can be set first time (from scratch) or later adjusted in either one direction, up or down, or backwards or forwards. Any change in DD (504) automatically impacts EE (505) and as such this is directly reflected in graph EE (505).

Graph EE (505): Pension Capital/Return on Investment. (See FIG. 7.5)

As a result of any change/update in graphs AA (501), BB (502), CC (503), and/or DD (504) the application automatically generates a graph for the Pension Capital/Return on Investment (EE (505)). This provides the user with immediate insight whether or not the reached level of capital is sufficient enough to reach his goals of retirement planning. Correcting the level of EE (505) can be achieved by changing AA (501), BB (502), CC (503), and/or DD (504). A simple example is given of how the scenario testing works.

By drawing a line in Graph AA (501), Annual Savings is assumed to be the shape and the volume presented by this line: Scenario(1)

By drawing a line in Graph BB (502): Stock Prices is assumed to be the shape and the volume presented by this line: Scenario(1)

Now you can look at Graph EE (505) and interpret the effect of given annual savings by given stock returns (or portfolio).

By drawing a line in Graph CC (503): Annual pension payments is assumed to be the shape and the volume presented by this line: Scenario(1)

Now you can look at Graph EE (505) and interpret the effect of given annual savings by given stock returns (or portfolio) and given annual pension payments.

A result of the scenario test is when the presented line in Graph EE (505) is under the level of zero that there is a possibility of a shortage in the expected retirement scheme.

By a simple movement of the mouse or finger in Graph AA (501) the premium can be adjusted in either one direction, up or down, or backwards or forwards: Scenario(n)

By a simple movement of the mouse or finger in Graph BB (502) the Stock Prices can be adjusted in either one direction, up or down, or backwards or forwards: Scenario (m). The risk of the portfolio can be adjusted. By a simple movement of the mouse or finger in Graph CC (503) the annual pension payments can be adjusted in either one direction, up or down, or backwards or forwards: Scenario (t).

All scenarios can be tested and the effects of changing one or more of the input variables are immediately presented. Through continuous scenario testing with miscellaneous assumptions related to investment risk, premium level, retirement payments and longevity the user can find the optimum in easy, quick, visual and reliable way, without the need for extensive number crunching nor need for subject matter expertise.

EXAMPLE 3

A third example to illustrate an embodiment of the invention, concerns an advertisement model.

As has been discussed, in prior art, e.g. Google AdWords is a tool from Google that supports people/companies to find the best advertising possibilities on Google's search engine. By selecting a combination of chosen word(s), the price a company is willing to pay for being found on Google's search engine and the number of estimated hits (clicks), a company can make a strategy for achieving its goals. Nevertheless the usability of Google AdWords is quite complex, especially for smaller businesses, very cumbersome and not user-friendly. Therefore, developing a strategy for a marketing campaign by Google AdWords is quite laborious. It's a kind of trial and error process. This example will illustrate an embodiment of the invention which will overcome some of these mentioned disadvantages.

In this example, the model comprises three parts, namely a graphical input, a central data and calculation unit (i.e. the heart of the model) and a graphical output. The input can be generated by just drawing a line in a chart. The created input can be switched and become output and vice versa, according to an embodiment of the underlying invention. The output, when used as an input parameter, can be generated by just changing one or more values of a variable, by altering a line or bar in a chart. Through this, scenarios can be visually optimized in a truly 2-way interactive manner. All the input and output variables are interrelated to each other, so changing one will take directly effect on the other related variables. Also, there is no lack of time between the calculation and the presentation.

The following five related variables are of importance: the maximum cost per click ("Max CPC"), the position of an advertisement on the search engine web pages ("Position"), the estimated clicks ("Estimated Clicks") on the advertisement appearing in search engine, budget ("Budget") made available on a daily basis and the actual resulting clicks per day.

The "Max CPC" is the maximum price a person/company is willing to pay for a word or string of words when someone clicks on the company's advertisement in the search engine. The chance that a company's advertisement can be (quickly) found is correlated to the position on the search page. So there is a statistical relation between the Max CPC and the Position. The more a company is willing to pay, the quicker an advertisement may be found, and the more chance that someone will click on the advertisement. However this also depends on other persons/companies bidding for the same "word(s)". Bidding is done through the search engine's virtual auctions and in general by multiple persons/companies on the internet. The price that a company has to pay is the total number of clicks (sum) multiplied by the CPC. This price is preferably set on a daily basis.

The problem is that a company does not know what price to bid for a word or string of words in order to get the number of required clicks. Companies desire to develop strategies based upon more precise indications of what prices to bid per CPC so they can achieve the optimum result (number of clicks) within a certain available marketing budget. Today, all a person/company can do is define a budget and bid price for every CPC. This may still work reasonably for a one word campaign, without many complications, but when using multiple words and word combinations, it is almost impossible. Optimizing has to be done by trial and error and therefore is cumbersome and very time-consuming.

Preferably, 10 or more words or word combinations can be graphically visualized, providing the user or company an overview of the related CPC, estimated clicks and position of the word or word combinations. By moving the data points on one or more graphs all other related data points will be updated immediately, in accordance to their statistical relationship between the CPC, Position and expected or estimated clicks. Per day the related Budget and total clicks of all chosen words are directly shown.

When changing the Position, the CPC is changed as well as the Estimated Clicks. Also the daily Budget is adapted and so is the total expected clicks for that day. When changing the daily Budget (because the CPC is set for that specific day), the Estimated Clicks will be scaled according to the CPC and Position. Likewise, when changing the daily Clicks (because the CPC is set for that specific day), the Estimated Clicks will be scaled according to the CPC and Position. On a daily basis the Position, CPC or number of Clicks can be changed to achieve an optimum for each individual day.

This example makes it possible for persons/companies to fix any variable at any time and it allows creating the optimum scenario with the chosen input or output, this just by drawing new lines or moving existing lines in graphs.

At the one hand, the input is displayed graphically and data can be changed or added, by manipulating the graph without any need for input through a keyboard. At the other hand, the manipulation can be done by changing input into output and vice versa. The results can be easily optimized by just changing the data points in the graphical representation or when the results no longer match with the input, by just changing that input. By switching from one graph to another graph, functionality is activated to switch from input to output and vice-versa.

For example, a company has defined the strategy to realize 10 Clicks on word "A" and 15 Clicks on word "B". This can be achieved by configuring the wanted adjustment to the graph of the Estimated Clicks (707). The Position (706) and CPC (705) graph are immediately updated, so is the Budget Graph (701). When the Budget exceeds the set budget, the campaign will end for that day. This can be achieved by configuring the wanted adjustment by pooling on the graphs or just drawing a line. If the adjusted Budget is exceeded, the CPC is reduced and the paid campaign ends for that day.

The embodiment is advantageous as it simplifies the adjustments for a campaign and as it optimizes the result of the invested money and click results.

The statistical relationship can be calculated for the words between the CPC and the expected clicks by day by means of an API (e.g. such as an API to Google Adwords). This is done on a daily basis as the behavior of the public can differ every day, and as such the CPC can also differ each day. From every word or string of words, statistical historical information is captured and added to a database on a daily basis.

The CPC, the Cost per Click is a statistically defined price and depending on the total number of buyers who are eager to bid on the word. The more potential buyers there are, the higher the bid price can be. The statistics for generating the related "word" data is made by simulating the data presented in e.g. AdWords. Representative snapshots are made at several times/days.

The CPC is the main condition for the ranking on the expected hit rate. CPC multiplied with the number of Clicks is the related Budget for that day for that word. If the daily Budget is consumed the campaign for that day stops.

By giving the word a Budget and given CPC the Budget can be consumed within the day. The hits can limit to a maximum by a limited Budget and/or limited CPC. Preferably, an element, preferably a button, can be used in the model to limit or fix the values of the variables. The Position is directly related to the CPC. So what applies to the CPC also applies to the Position. Clicks can be set to a certain value. More Clicks will lead to more Budget.

The optimization is made between the CPC's of the words. Given that a word does not have the same CPC on every day and given the wanted Clicks, it is easy to generate a strategy for the chosen words. By collecting the historical data of the used strategy it's possible to make a judgement on the wanted results.

The embodiment optimizes the wanted results of a marketing campaign. It starts by choosing a word or word combinations that a company wishes to use in the campaign. With the term "word" also word combinations are to understood in the underlying invention.

The CPC (the maximum price or cost a company is willing to pay per click) of the chosen words can be selected by the user. The relation to the other variables is given by the statistics of the provider. The embodiment comprises a graph (705) representing the CPC on the y-axis in a wanted currency and on the x-axis the chosen words/word combinations. By pulling or moving the mouse or the finger over the graph, the wanted CPC per word can be chosen. The value of the CPC by the chosen word can differ each day. So the set CPC can differ each day. The graph of the CPC represents the CPC of the given day.

In addition to the CPC the Position ranks the word against the advertisements of other companies. The Position of the chosen words can be selected by the user.

The relation to the other variables is given by the statistics of the provider. The Position of the words depends on the chosen CPC and the CPC of the other bidders. The embodiment comprises a graph (706) representing the Position on the y-axis in the wanted ranking and on the x-axis the chosen words/word combinations. By pulling or moving the mouse or the finger over the graph the wanted Position per word can be chosen.

The number of Estimated Clicks by the chosen word can differ each day. So the set wanted Clicks per word can differ each day. The graph (707) f the Estimated Clicks represents the number of Clicks of the given day. The estimated Clicks of the chosen words can be selected by the user. The relation to the other variables is given by the statistics of the provider. The Estimated Clicks depends on the chosen CPC. The embodiment comprises a graph representing the number of wanted Clicks per word on the y-axis and on the x-axis the chosen words/word combinations. By pulling or moving the mouse or the finger over the graph the wanted Estimated Clicks per word can be chosen.

The Click Through Rate (CTR) of the chosen word can differ each day. The graph (704) of the CTR represents the chance that a click on the given word will be clicked through on the given day. The CTR of the chosen words can be selected by the user. The relation to the other variables is given by the statistics of the provider. The CTR depends on the chosen CPC. The embodiment comprises graph representing the percentage (change) of CTR per word on the y-axis and on the x-axis the chosen words/word combinations. By pulling or moving the mouse or the finger over the graph the CTR per word can be chosen.

The relation of the word values like CPC, Clicks, CTR and Position is given by the statistics of the provider. However an estimate can be made of the relationship between these variables. But that means a lot of manual number crunching has to be performed.

The combination of CPC, Position, CTR and Estimated Clicks gives the Budget for a specific word at a given day. The combination of CPC, Position, CTR and estimated Clicks gives the resulting Clicks for a specific word at a given day.

The Budget can be optimized by setting the word values (CPC, Position, CTR, Estimated Clicks) but also by setting the limited Budget per day of the wanted Clicks per day. The model uses the relationship set to CPC/Position/CTR/Estimated Clicks of the given words for the specific day to adjust the Budget. The embodiment comprises a graph representing Budget per day of all given words on the y-axis and on the x-axis the days. By pulling or moving the mouse or the finger over the graph the Budget per day can be adjusted and the number of estimated Clicks ergo the resulting Clicks is changed. When the limited Budget on the given day is reached, the set campaign for that day will be stopped. In this way the Budget for the day can be limited, keeping in mind the wanted Clicks and CTR. By changing the relationships between the set CPC, Position or CTR of the words optimizing the resulting Clicks and/or Budget is easily done.

All input and output variables are interrelated to each other. The input can be changed into output and vice versa. By changing the CPC the Position the estimated Clicks, the CTR, the Resulting Clicks and the Budget changes. By changing the Position, the CPC, the estimated Clicks, the CTR, the Resulting Clicks and the Budget changes. By changing the Estimated Clicks, the CPC, the Position, the CTR, the Resulting Clicks and the Budget changes. By changing the CTR the CPC, the Position, the estimated Clicks, the Resulting Clicks and the Budget changes. This is all related on a daily basis. By changing the Budget the number of Resulting Clicks changes, the estimated Clicks changes, The CPC, Position and CTR remains the same. By changing the Resulting Clicks the Budget changes and the Estimated Clicks changes. The CPC, Position and CTR remain the same. This is all related on a daily basis.

By storing the data of the previous days, a comparison can be made with the setting in the past and a better campaign setting can be made. In the graphical representation this is easily done.

By fixing one or more of the variables, all combinations can be made. The CPC, Position and CTR are interrelated. Changing or fixing one of these three means also changing or fixing the others. By fixing the CPC the Position is fixed, the CTR is fixed; the estimated Clicks can be changed, through which the Resulting Clicks changes and the Budget changes. By fixing the estimated Clicks, the resulting Clicks are also fixed. The CPC can be changed (also the Position and CTR changes or can be changed). By changing the CPC the Budget changes (and the other way around).

In the application all logical combinations can be made. Illogical changes or combinations are prohibited. The data which simulates the statistical information of the provider is generated as off real time. As a result, the model represents a quite serious replica of the reality. The simulated data of the provider can also be collected by an interface to the centre of the information of the provider.

Figure 8:
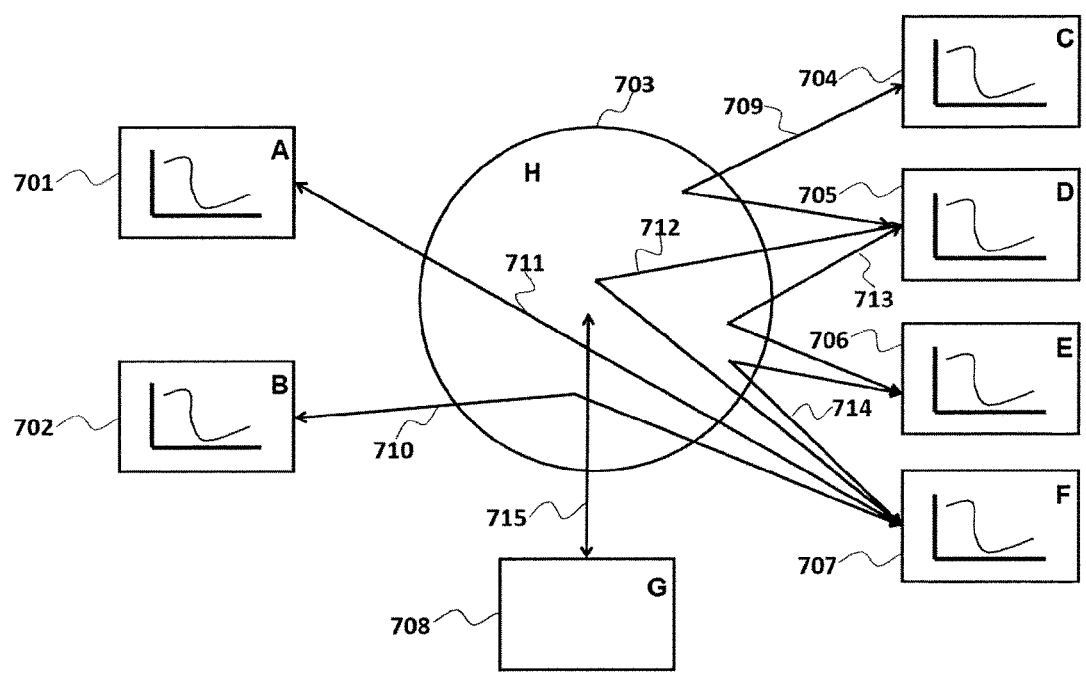
FIG. 8 is a diagrammatic illustration of an exemplary method of visualizing and manipulating graphic charts, in accordance with an embodiment of the present invention.

FIG. 8 is a diagrammatic illustration of this exemplary advertisement model for visualizing and manipulating graphic charts, in accordance with an embodiment of the present invention.

Graph A (701) shows the Budget per day of all chosen words represented in given period. Graph B (702) shows the Sum of Clicks per day of all chosen words represented in given period. Graph C (704) shows the CTR ("Click Through Rate"), Clicks True per chosen word/word combination per day. Graph D (705) shows CPC, Cost Per Click per chosen word/word combination per day. Graph E (706) shows Position per chosen word/word combination per day. Graph F (707) shows the Estimated Clicks per chosen word/word combination per day.

Element H (703) represents the mathematical model which calculates the dependencies. Element G (708) represents the statistical database owned by the provider which provides the relationship between the word variables.

Arrow (715) represents the relationship between CPC/Position/CTR and Estimated Clicks=the value(s) of the daily auction of a word or word combination generated by the provider.

Arrow (709) represents the relationship:
CTR=percentage of Estimated Clicks per chosen word/word combination per day related to CPC in accordance with the statistics of the provider.

Arrow (710) represents the bidirectional relationship:
Sum of Clicks per day=Sum of [Est. Clicks per word(s) per day].

Arrow (711) represents the bidirectional relationship:
Budget per day=Sum of [Estimated Clicks per word(s) per day×CPC per word(s) per day]

Arrow (712) represents the bidirectional relationship:
Estimated Clicks per word per day=number related to CPC in accordance with the statistics of the provider.

Arrow (713) represents the bidirectional relationship:
Position per word per day=ranking related to CPC in accordance with the statistics of the provider.

Arrow (714) represents the bidirectional relationship:
Est. Clicks per word per day=number related to Position in accordance with the statistics of the provider.

Note that the adwords application or better, campaign optimizer can also be expanded with a semantic feature. Within this semantic feature the available data (database) can be screened with semantic technology in a way that the most relevant information can be obtained for the purpose to form the ad(vertisement) and also to filter the most relevant keywords. This semantic feature can be a part of an efficient automatisation or act as an assistant of the user to set up the campaign.

EXAMPLE 4

In a matrix model, the number of variables is irrelevant. It can be either 2, 3, 4, etc. The essence is that each variable must be a variable in itself. This means that each variable has to be able to be defined in a single or singular variable expression and not as a nested variable. FIG. 9 is a schematic example of a matrix model with three singular expressible variables a, b and c, in accordance with an embodiment of the present invention. The mathematical relation in this example can be expressed by a=b+c, wherein b can be expressed as a−c and c can be expressed as a−b.

EXAMPLE 5

FIG. 10 is a schematic illustration of a matrix model, in accordance with an embodiment of the present invention.

In the coming matrix model illustrations, columns correspond with input variables, rows with output variables.

For the mathematical expression a=(a.b)+c, there is not an unambiguously relation defined. The relationship needs to be rewritten in a way it is an unambiguous in variable a or in other words, it has to be expressed as a single or singular variable. Expression a=(a.b)+c can be rewritten as c=a−(a.b) and further as c=a.(1−b) and further as a=c/(1−b). Similarly we can derive the expression for b=1−c/a and also for c=a−(a.b).

FIG. 11 is a schematic illustration of the first row of the matrix model in FIG. 10. When we want to calculate a value for variable a, there are 2 possible ways, i.e. by changing variable b or by changing variable c. If we are manipulating or changing variable b, variable c is fixed and behaves like a constant. If we are changing variable c, variable b is fixed and behaves like a constant. The variable a is changing in relation to the chosen variable b or c.

With respect to said first row, suppose b=2 and c=3, then a=3/(1−2)=−3. When we change b from 2 to 3 the next result will arise: b=3 and c=3, so a=3/(1−3)=−3/2. Here variable c behaves like a constant (i.e. 3). When we change c from 3 to 6 the next result will arise: b=2 and c=6, whereby a=6/(1−2)=−6. Now variable b behaves like a constant.

Because of the correct splitting of the variables in an unambiguous relation and the fixing of variables, the variables can be transformed from input to output and vice versa. In this form, a circular reference caused by the variables is impossible. There is no nesting, or better, nesting is preferably not allowed.

In quite complex relations, it can be hard to determine the inverse relationship between multiple variables. The solution can be found with different mathematical solution methods.

EXAMPLE 6

A preferred embodiment of the 2-way method is to fix the value of variables, when they are activated as a result of the manipulation of an input variable. Said activated variables are fixed and behave like constants. When the variable, which will be the active input variable, is activated, the whole data array corresponding with this input variable will be replaced directly in values. All the other variables, if related to the active input variable are dependent functions written as a function of said input variable. When another variable is activated as the input variable, the same process will start all over. All these processing will be done by a calculation engine.

The matrix is the way the relations between the variables are regulated. From the matrix the data array, which is related to the graph, is filled by the calculation engine, which has incorporated the adjusted formulas from the matrix. This process will reduce calculation time. Because in a traditional way the calculation would have to be done in more than one step and more calculation engines would be needed. Now, by switching between input and output one calculation engine suffices and processing is reduced to a minimum.

FIG. 12 is a schematic illustration of a matrix model, in accordance with an embodiment of the present invention. In this example, every parameter or variable is suggested to be represented by a graph.

First, we define the parameters as a function of the other parameters:

a) Parameter 1 is defined as a function in parameter 2 and parameter 3 b) Parameter 2 is defined as a function in parameter 1 and parameter 3 c) Parameter 3 is defined as a function in parameter 2 and parameter 1

The matrix in which the relationships between the parameters are written is shown in FIG. 12. The column represents the parameter on which manipulation is done The row is showing the parameter with value changes when manipulating the parameter in the concerning column, i.e. the output variable being represented in a corresponding graph. In this example:

P1=P2+P3

P2=P1−P3

P3=P1−P2

For instance, manipulating parameter P1 (cfr. column 1) will change parameter P2 in row 2 and P3 in row 3, whereby parameter P3 and P2 are respectively fixed and considered to be constants.

Manipulating parameter P2 (cfr. column 2) will change the parameter P1 in row 1 and P3 in row 3, whereby parameter P3 and P1 are respectively fixed and considered to be constants.

Figure 13:
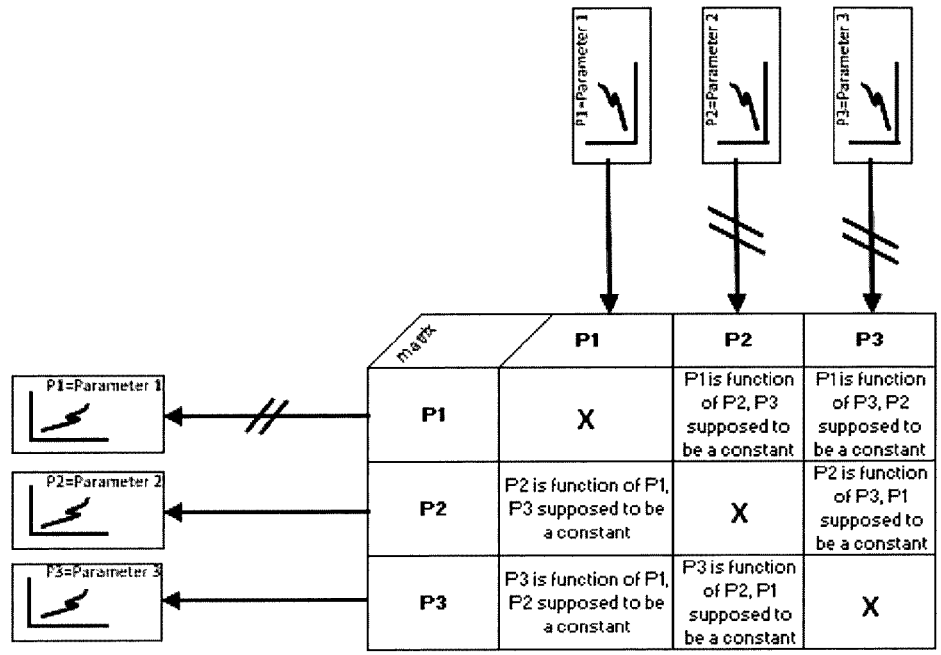
FIG. 13 is a schematic illustration of manipulating variable P1 in the matrix model of FIG. 12.

FIG. 13 is a schematic illustration of manipulating variable P1 in the matrix model of FIG. 12. In this illustration parameter P1 is manipulated (cfr. column 1). A crossed arrow, corresponds to a fixing or non-activating of a (input/output) variable.

If we change parameter P1, parameter P2 represented in the corresponding graph will change (cfr. row 2). Parameter P3 is fixed and considered a constant. If we change parameter P1, parameter P3 represented in the corresponding graph will change (cfr. row 3). Parameter P2 is fixed and considered a constant.

Figure 14:
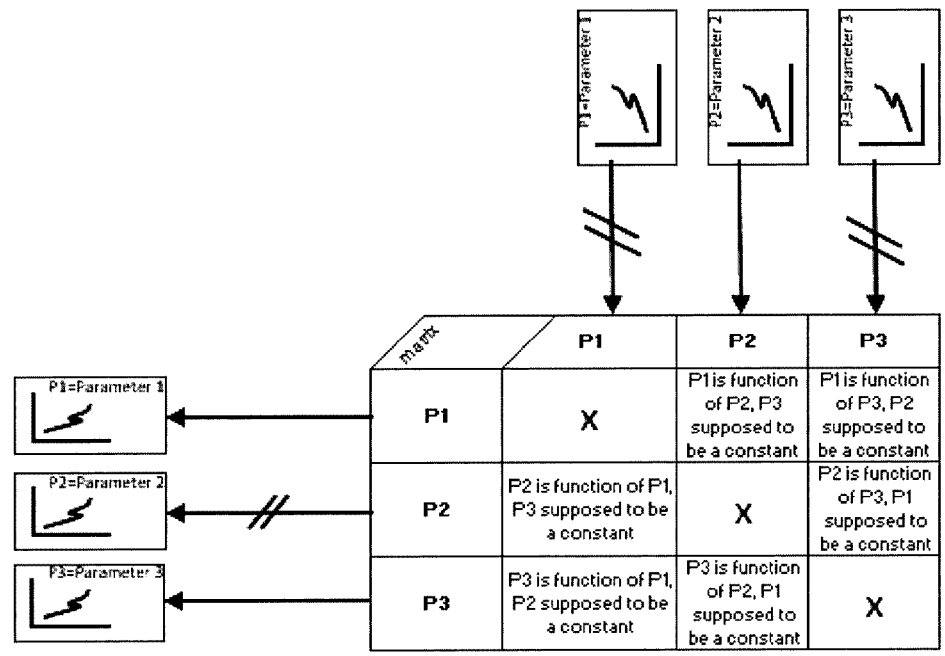
FIG. 14 is a schematic illustration of manipulating variable P2 in the matrix model of FIG. 12.

FIG. 14 is a schematic illustration of manipulating variable P2 in the matrix model of FIG. 12. In this illustration parameter P2 is manipulated (cfr. column 2 ).

If we change parameter P2 , parameter P1 represented in the corresponding graph will change (cfr. row 1). Parameter P3 is fixed and considered a constant. If we change parameter P2 , parameter P3 represented in the corresponding graph will change (cfr. row 3). Parameter P1 is fixed and considered a constant.

Figures 15, 16:
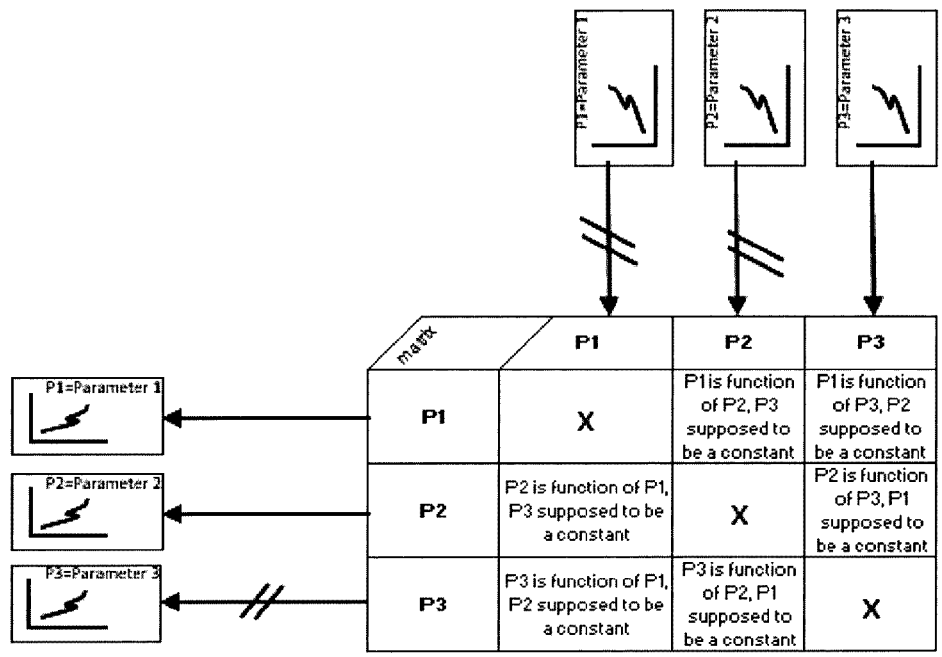
FIG. 15 is a schematic illustration of manipulating variable P3 in the matrix model of FIG. 12.
FIG. 16 is a schematic illustration of a general matrix model, in accordance with an embodiment of the present invention.

FIG. 15 is a schematic illustration of manipulating variable P3 in the matrix model of FIG. 12. In this illustration parameter P3 is manipulated (cfr. column 3).

If we change parameter P3, parameter P1 represented in the corresponding graph will change (cfr. row 1). Parameter P2 is fixed and considered a constant. If we change parameter P3, parameter P2 represented in the corresponding graph will change (cfr. row 2). Parameter P1 is fixed and considered a constant.

EXAMPLE 7

By making a model for scenario calculation first, the issue must be analyzed. The mapping of the problem is the first step to take. Subsequently the variables can be distilled and their relationships be determined. Subsequently, complex nested variable expressions are transformed into singular variable expressions.

FIG. 16 is a schematic illustration of a general matrix model, in accordance with an embodiment of the present invention. The relationship between input variables and output variables is written in the matrix. The architecture is a 2-dimensional matrix such as A=x.B. The variables within the matrix dimension are related to a graph. This concerns the input as well as the output variables written in the matrix. Just by 'transposing' the matrix, input and output switch places.

When developing a model, normally input and output variables are distinguished. The variables concerned are multi-variables, i.e. a time series or another series of variables.

Normally a calculation would be made by entering input, subsequently make the calculation and as a result, there will be output. The 2-way calculation provides that you can reverse the process by making the output the input variables. The method in underlying invention provides a better solution for turning the input-to-output matrix into an output-to-input matrix.

This process is not always necessary. You can also use this technique just for visualizing the problem or as a method of distinguished analyzing. The technique of making a nested function in a singular function also makes a problem more visible and easier to understand.

Figure 17:
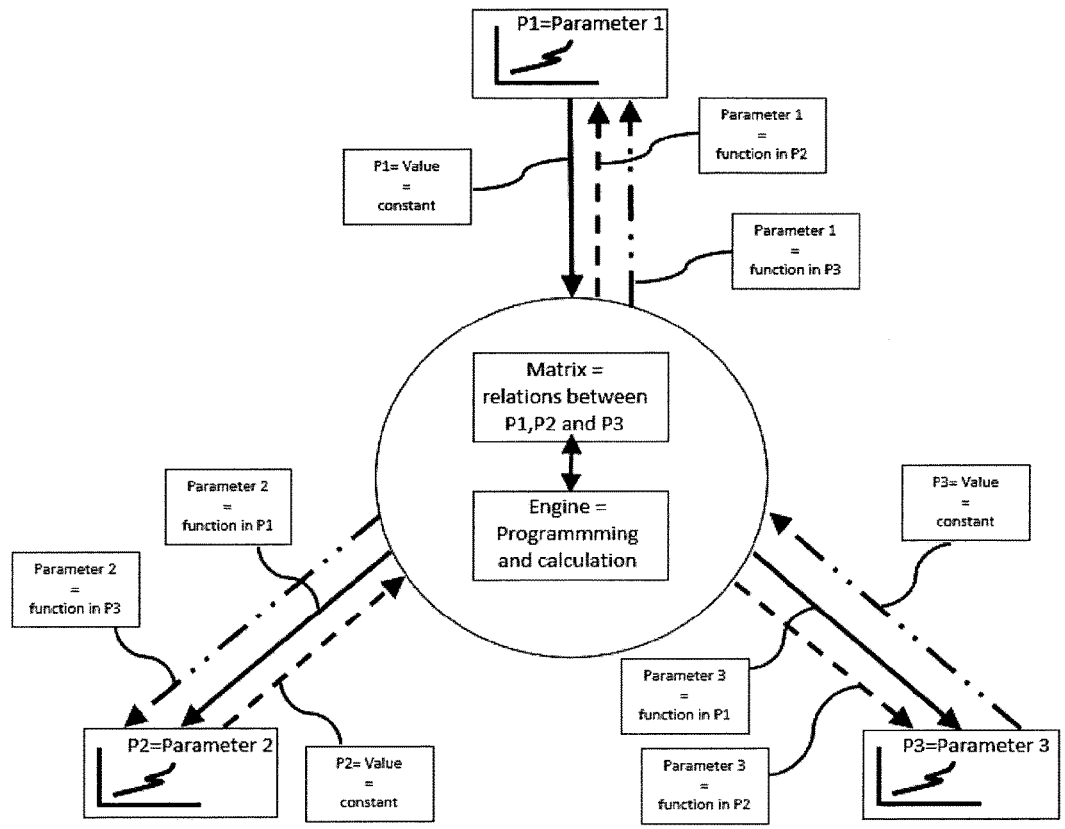
FIG. 17 is a schematic illustration of manipulating the variables of the general matrix model of FIG. 16.

FIG. 17 is a schematic illustration of manipulating the variables of the general matrix model of FIG. 16.

By connecting the variables with a graphical representation, the variables are interactive. By manipulating (e.g. mouse movement on the graph) the graphical form, the variables will change and also the input will change. Changing the input will activate the calculation engine. Subsequently the output variable in a graph will be calculated.

Within this example we use the values of the graphs as the data that is been manipulated by the other parameters. These values can also be databases or any form of dataspace without a connection to the graphical visualization.

When the variable P2 is changed by manipulating variable P1 (or either any change in parameter) the related formula to parameter P2 is activated and the related inversed formula related to parameter P2 is fixed, as a result the array of the values of parameter P1 is pasted into values. This way a circular referencing is avoided.

The method in underlying invention reduces the calculation and processing time with an immense amount of time. The whole process of changing the input to output and vice versa is in this way reduced just by making a conversion from the formula related to the one parameter into the (inverse) function in the other parameter.

Figure 18:
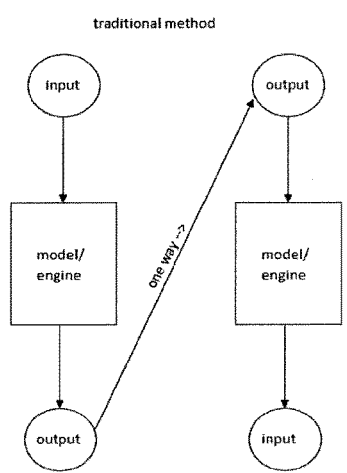
FIG. 18 is a schematic illustration of manipulating a 'one way'-variable.

Tradionally, a total conversion of the whole model would be necessary to make an inverse calculation. FIG. 18 is a schematic illustration of manipulating 'one way'-variable. In the same way parameters can be blocked or can be adjusted conform a predestinated pattern.

All the values of a parameter can be blocked by just setting the parameter off. Or better by fixing the related data array. This is a part of the total modelling process. It is possible to block every parameter by just pushing a related button which transforms the specific parameter in fixed values, for that specific issue.

The activation of the whole process is done by moving the mouse on the related graph of the to be adjusted parameter. This process or calculation, can be activated in different ways, depending on the complexity of the analyzed problem. The mouse is moving on the graph section of the parameter on an in advance determined grid. When the mouse crosses the grid the related coordinate and hereby value for the parameter function is activated. Hence the calculation process is started. Just by moving the mouse the calculation is activated or executed. By making the grid more or less refined the calculation process is more or less precise. The grid is defined as a part of the total analytical process. The distance between the coordinates of the grid are preferably a part of the analytical process.

FIGS. 19 to 27 are illustrative screenshots of a graphical user interface corresponding to the coming examples 8 to 16 respectively, in accordance with embodiments of the present invention. Said screenshots illustrate different interactive mathematical models.

EXAMPLE 8

Figure 19:
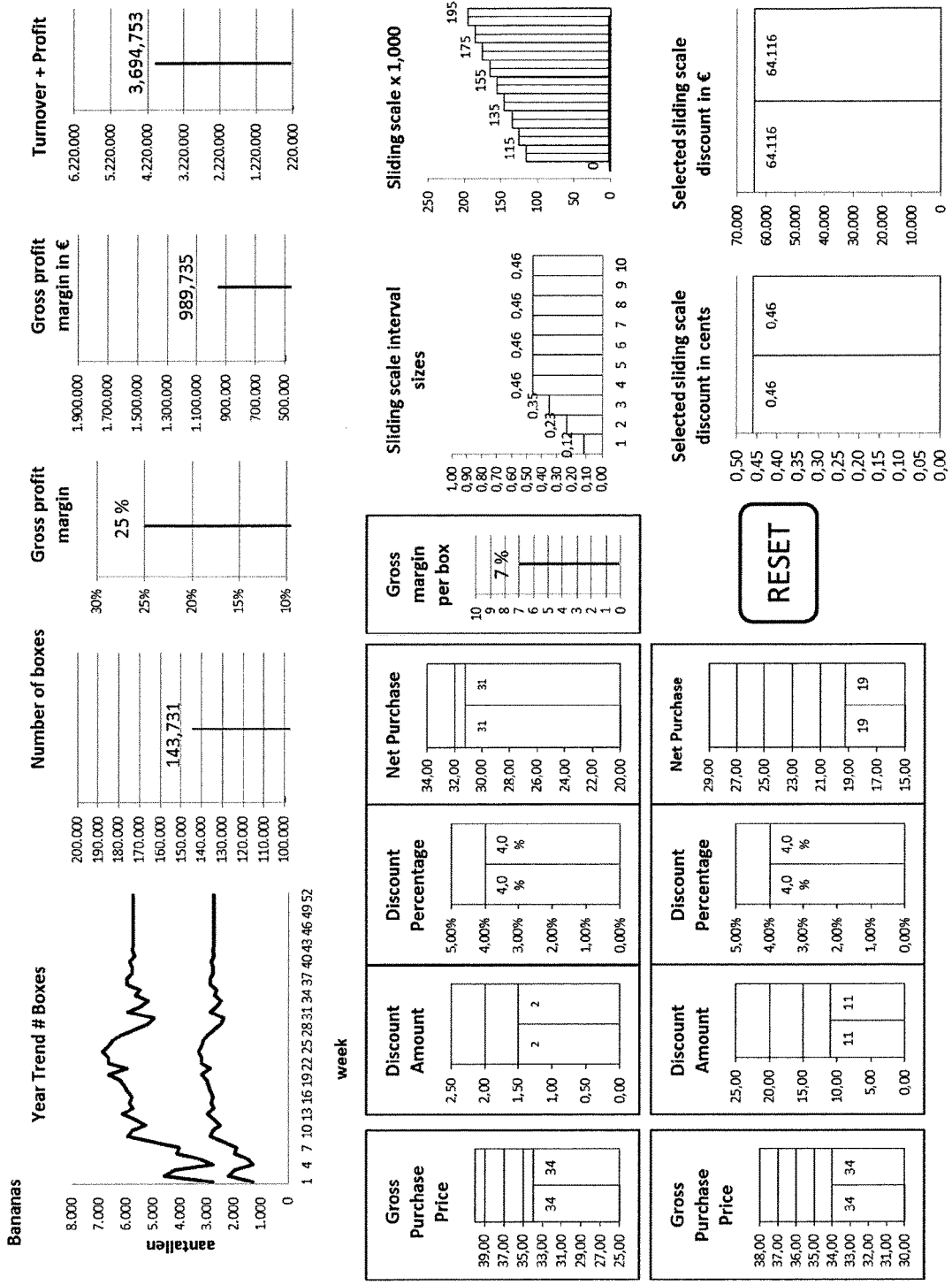

FIG. 19 shows a screenshot corresponding to a mathematical model for making a fair choice within the process of procurement strategy by using the mathematical theory of decision making and the theory of games.

It is advantageous as the suggested optimum can be tested by just pulling the "Brute Marge", the related input variables will optimized. The way around, pulling the input variables will test the output result as "Bruto Marge". Different strategies can easily be calculated and understood.

EXAMPLE 9

Figure 20:
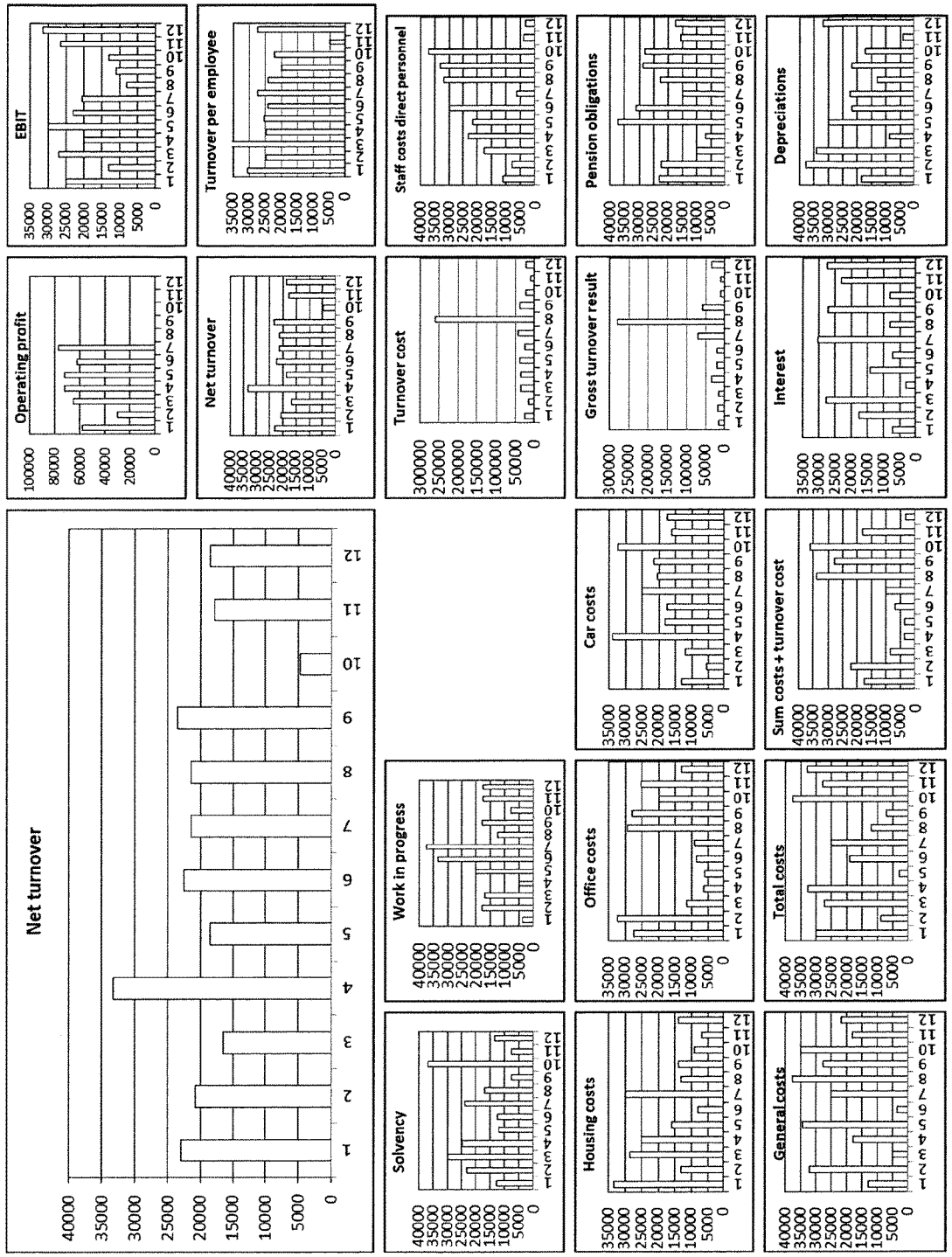

FIG. 20 shows a screenshot corresponding to a mathematical model for making cash flow prognoses over a period of a year, testing the influence of the different related parameters, and what decision must be made for the next year to optimize profit and stability.

It is advantageous as by changing the output variables as input, for instance the output "profit per employee" using as an input, margin can be optimized. Hereby the modeling time will be reduced.

EXAMPLE 10

Figure 21:
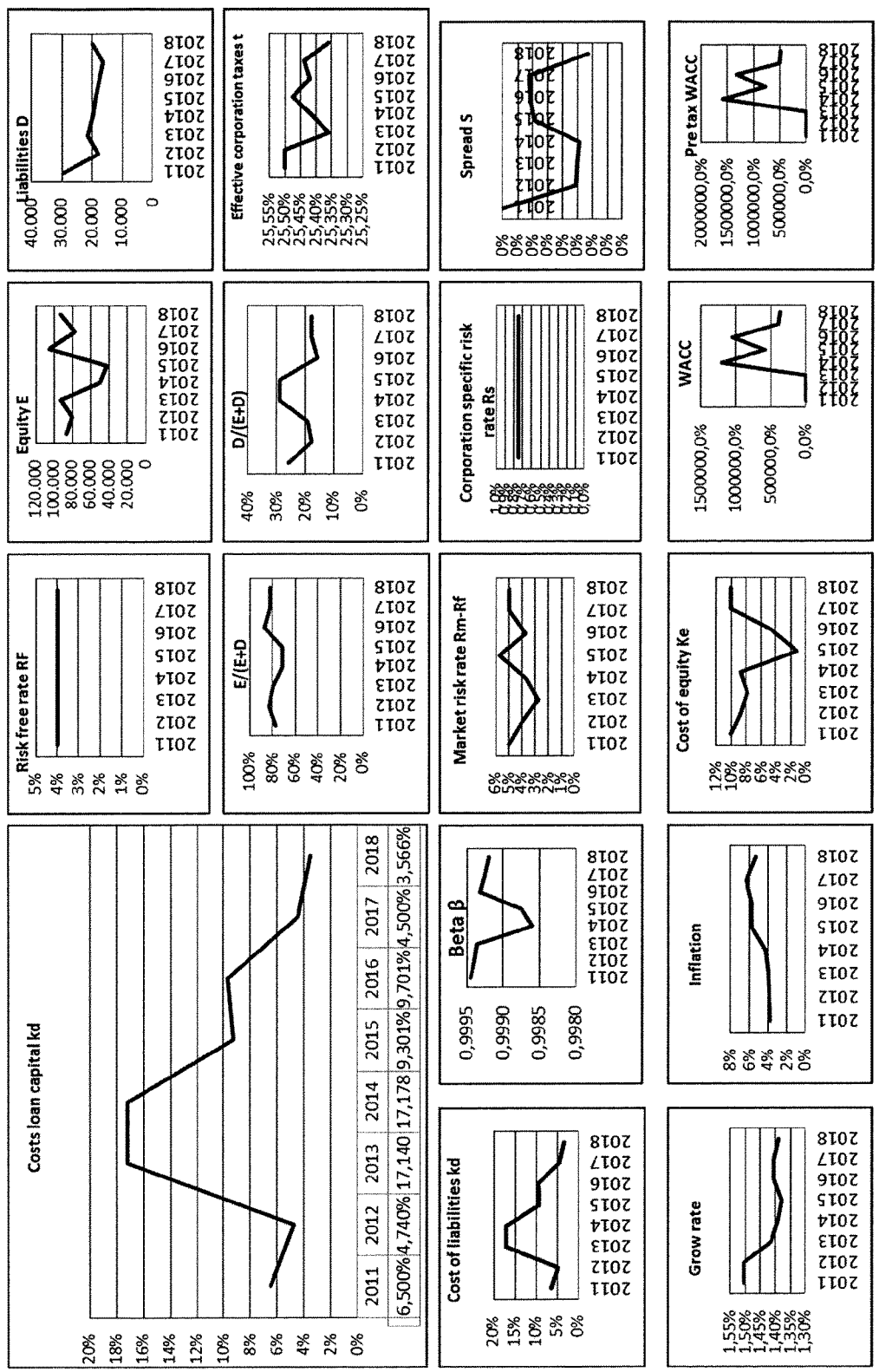

FIG. 21 shows a screenshot corresponding to a mathematical model for giving inside in the influence of all the related parameters to impairment and there interconnectivity.

It is advantageous as by changing any parameter, the impact on impairment is easily shown, and the way around, by changing the impairment the major affected parameter is easily shown.

EXAMPLE 11

Figure 22:
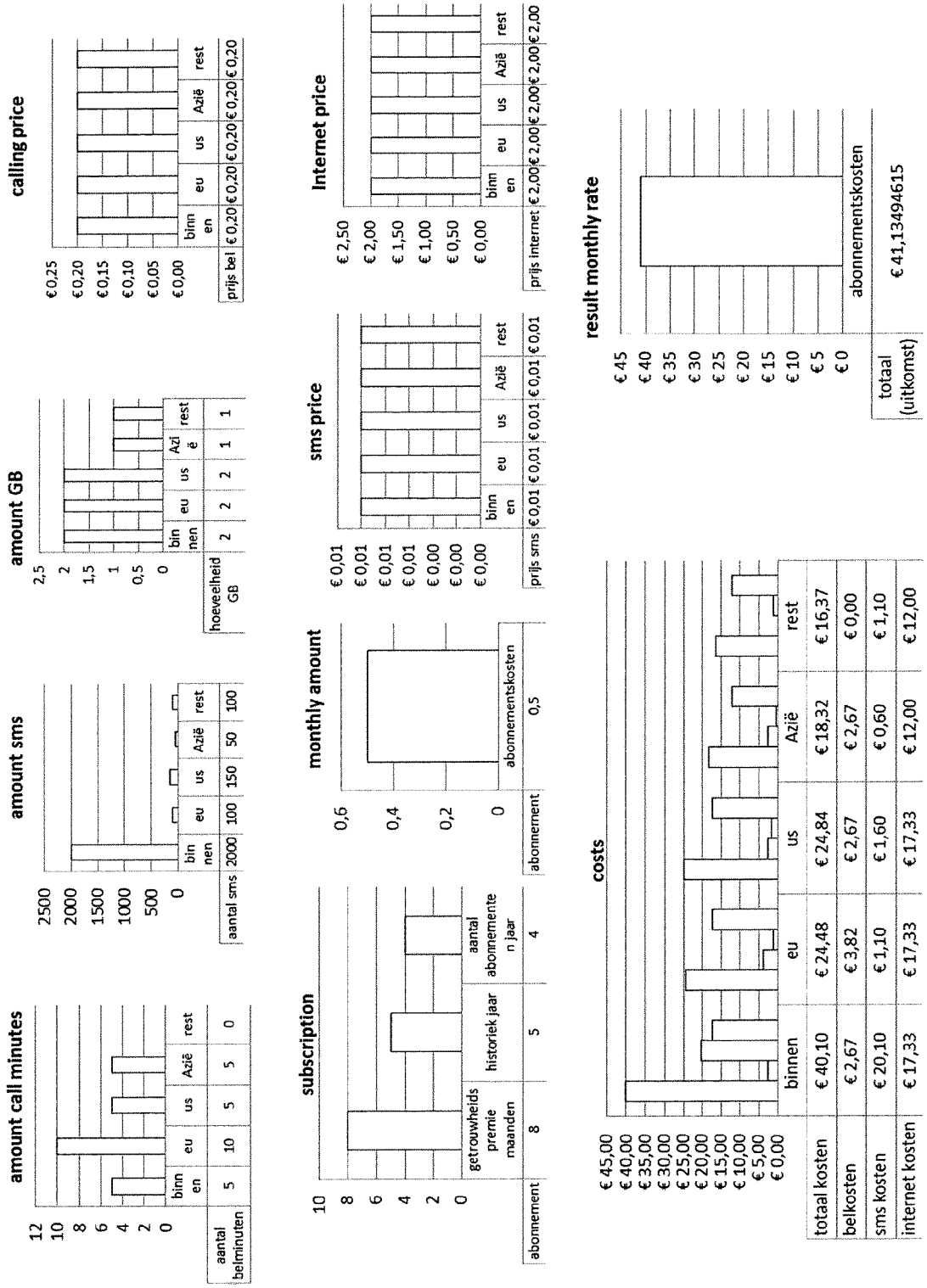

FIG. 22 shows a screenshot corresponding to a mathematical model for giving inside in the influence of all the related parameters to pricing and consuming teledata and there interconnectivity.

It is advantageous as by changing any parameter, the impact on price is shown. By maximizing the price and controlling the other input variables, a personal best implementation can be set.

EXAMPLE 12

Figure 23:
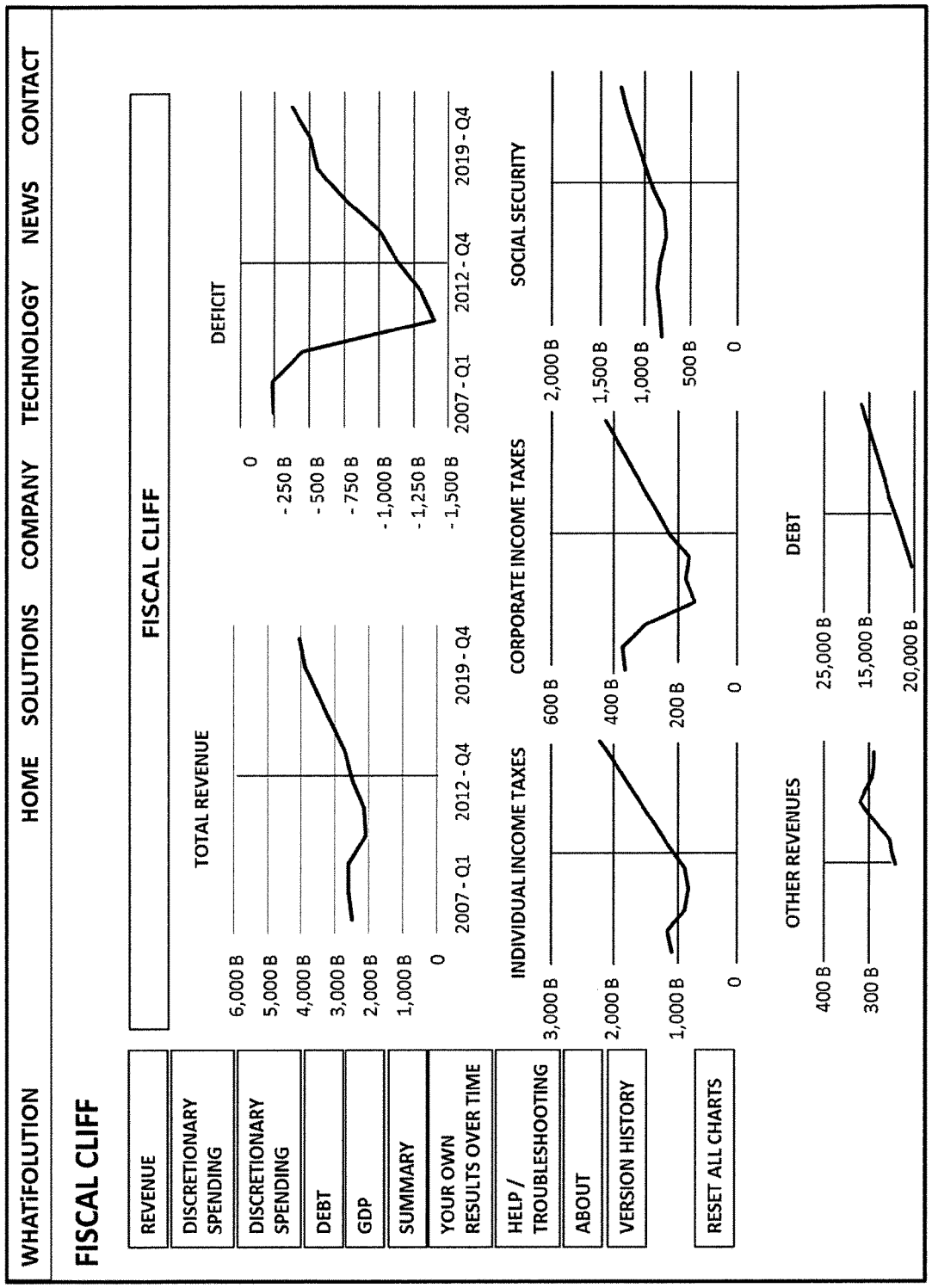

FIG. 23 shows a screenshot corresponding to a mathematical model for

This model is made with the object of giving inside in the influence of all the related parameters to the impact on the US deficit It is advantageous as by changing any parameter, the impact on the deficit is shown. Changing either 'revenues', 'spending' or 'interest', impact on the deficit can be shown and specific on the 'debt'. Vice versa by changing the 'debt', the major involved parameters are shown and can be recognized.

EXAMPLE 13

Figure 24:
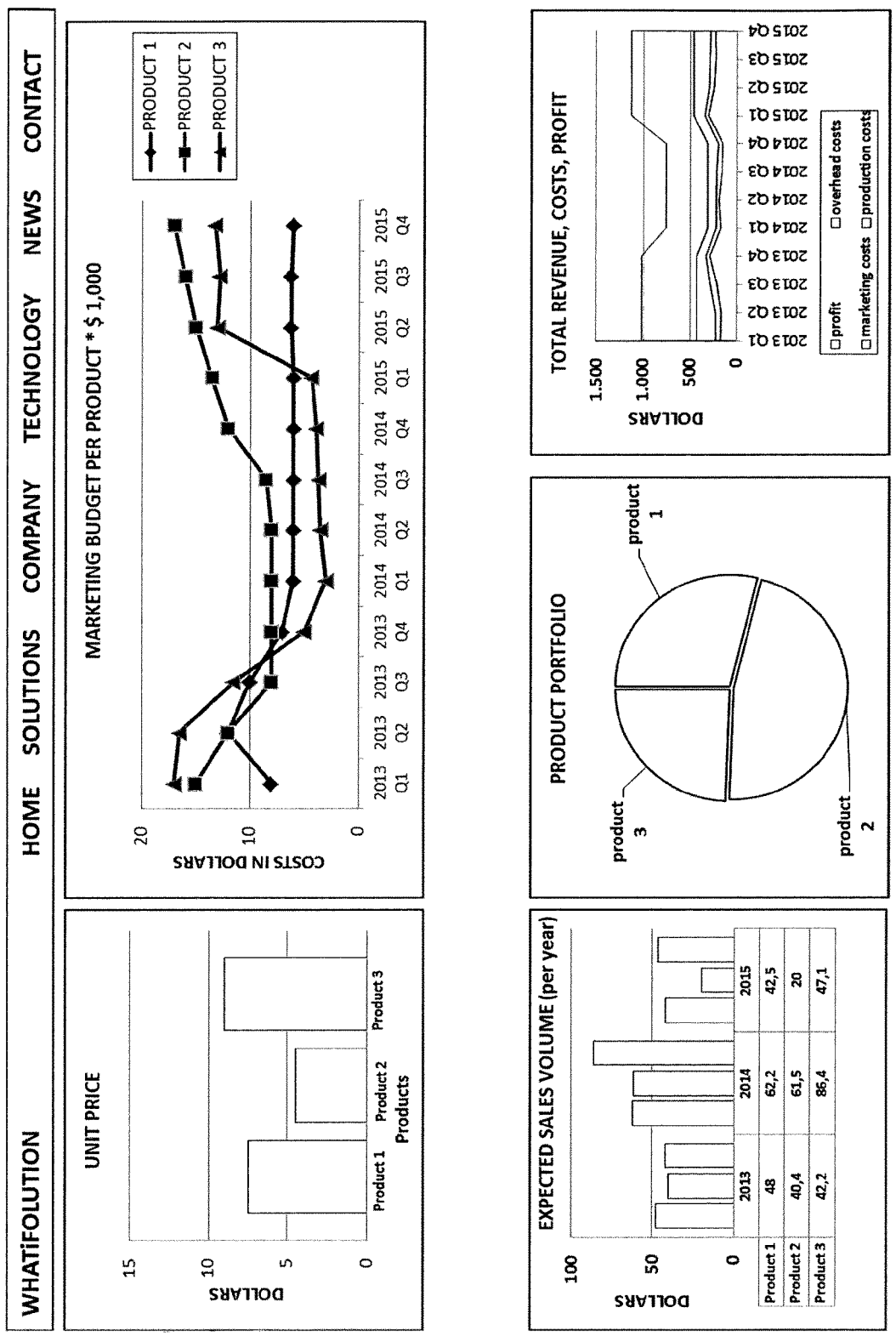

FIG. 24 shows a screenshot corresponding to a mathematical model for giving inside in the influence of all the related parameters to each other.

It is advantageous as by changing any parameter, the effect on the others is interactively shown. Input is output and vice versa.

EXAMPLE 14

Figure 25:
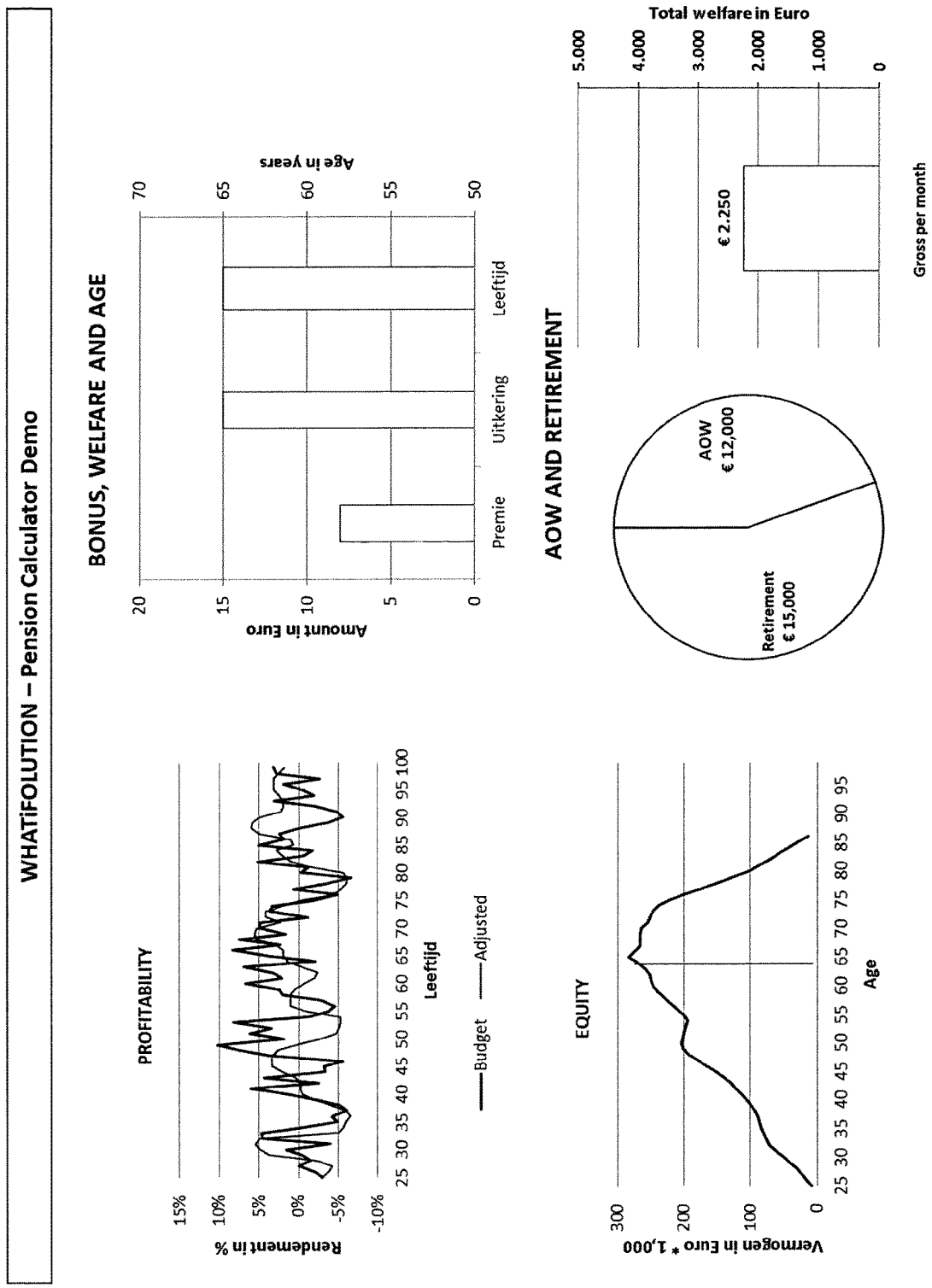

FIG. 25 shows a screenshot corresponding to a mathematical model for giving inside in the impact of all the related parameters to the consuming of an individual pensioner.

It is advantageous as by changing the return on investment the effect on income is shown, and the other way around, by changing income gives the required return on investment given the other parameters.

EXAMPLE 15

Figure 26:
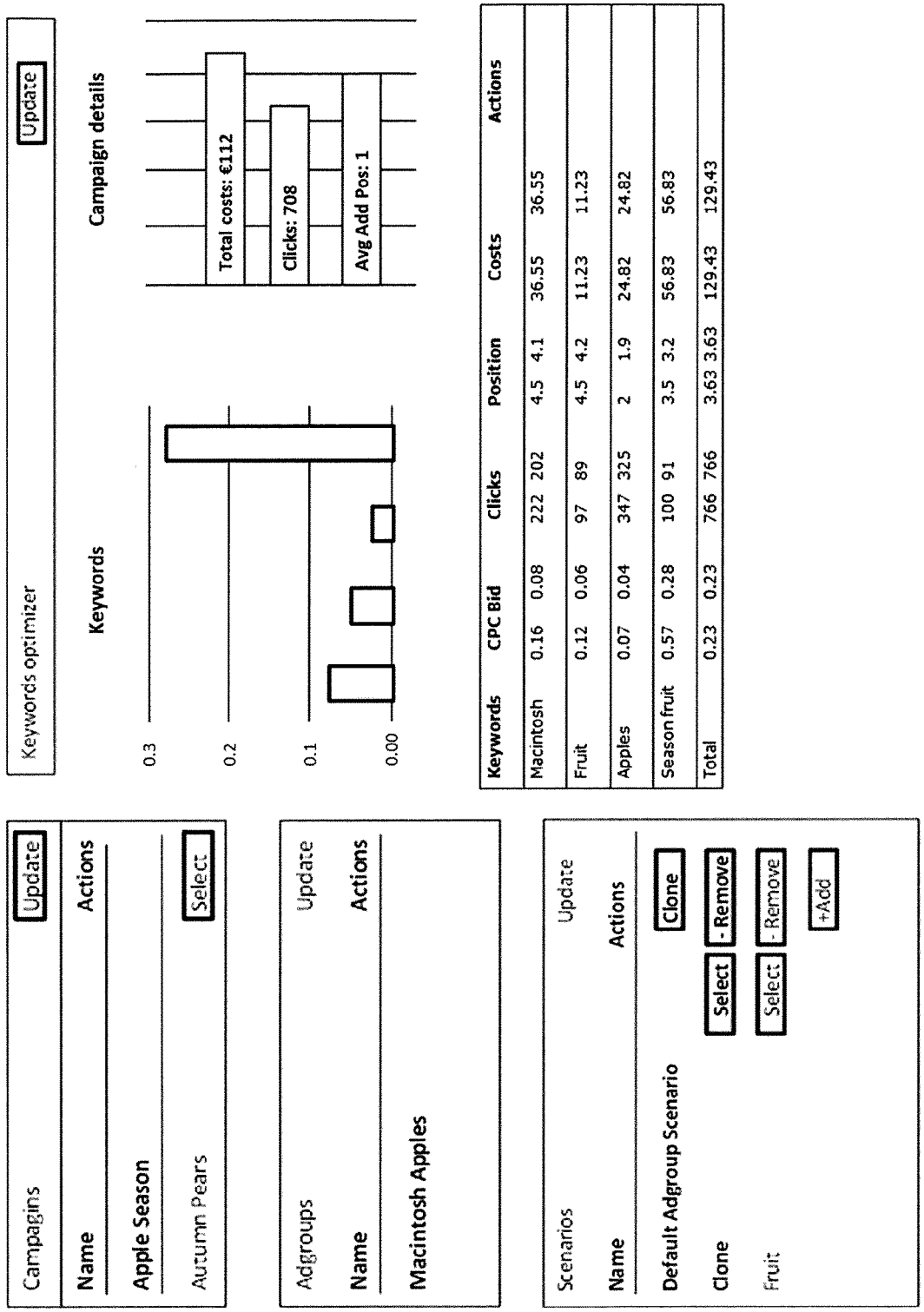

FIG. 26 shows a screenshot corresponding to a mathematical model for giving easy to use and big time reducing making a campaign strategy within Google Adwords. All the related parameters are shown in one view and changing one parameter shows the effect on the other related parameters.

It is advantageous as insight and the effect on the decision making process is granted.

EXAMPLE 16

FIG. 27 shows a screenshot corresponding to a mathematical model for giving easy to use selling and/or purchasing a car by the car-reseller. The impact of having a car in stock for a short or long time, together with the economic aspects is shown in one view.

It is advantageous as insight and the effect on the decision making process is granted. Hereby loss can be minimized.

While the invention has been disclosed in connection with the preferred embodiments shown and described in detail, various modifications and improvements thereon will become readily apparent to those skilled in the art. Accordingly, the spirit and scope of the present invention is not to be limited by the foregoing examples, but it is to be understood in the broadest sense allowable by law. All documents referenced herein are hereby incorporated by reference.

The invention claimed is:

1. A computer implemented method for visualizing graphic charts to one or more users, the method comprising:
creating n variables, wherein n is three or more;
creating multiple different datasets, comprising data points representing a relation between a subset of said variables;
creating one or more graphic charts each comprising a representation of one or more of said datasets;
displaying, via a graphical user interface, said graphic charts on one or more display elements; and
manipulating, via a graphical user interface, a dataset in a graphic chart,
wherein a mathematical model is created, wherein said relations between said datasets are determined by said mathematical model, wherein said relations work in a 2 way direction, and wherein said datasets and graphic charts are accordingly updated when manipulated, and wherein said mathematical model is a matrix model, comprising singular variable expressions.

2. The method according to claim 1, wherein updating a dataset corresponding to a variable is calculated by fixing values of variables other than said to be updated variable and a variable, which is being manipulated.

3. The method according to claim 1 further comprising: adding or deleting a dataset.

4. The method according claim 1, wherein creating or adding a dataset, comprises drawing a line on a displayed graphic chart by touch, mouse, sound, gestures or speech.

5. The method according to claim 1, wherein said mathematical model meets the following requirements:
v conditions are imposed between said n variables;
(n-v) is the maximum amount of free variables;
any of said (n-v) free variables can be chosen out of said n variables;
and the other v variables can be calculated on a 1-to-1 correspondence according to the v conditions.

6. The method according to claim 1, wherein each data set of a graphic chart represents a relation between two variables.

7. The method according to claim 1, wherein a dataset in a graphic chart is manipulated, via a graphical user interface, by moving a data point of a graphic chart to a desired position on said graphic chart by touch, mouse, sound, gestures or speech.

8. The method according to claim 7, wherein neighboring data points of said manipulated data point are manipulated by an interpolation method.

9. The method according to claim 1, wherein one or more datasets in a graphic chart are manipulated, via a graphical user interface, by a multitouch operation.

10. The method according to claim 1, wherein a display element is provided by a computing device which is connected to a database server via a network.

11. The method according to claim 10, wherein a display element consists of an area on a screen of said computing device.

12. The method according to claim 11, wherein two or more display elements are displayed on said screen.

13. A computer program product for visualizing graphic charts to one or more users using a computing device connected to a server via a network, the computer program product comprising at least one non-transitory computer-readable storage medium having computer-readable program code portions stored therein, the computer-readable program code portions comprising instructions for:
creating n variables, wherein n is three or more;
creating multiple different datasets, comprising data points representing a relation between a subset of said variables;
creating one or more graphic charts each comprising a representation of one or more of said datasets;
displaying said graphic charts on one or more display elements; and
receiving a result of manipulating a dataset in a graphic chart,
wherein a mathematical model is created, wherein said relations between said datasets are determined by said mathematical model, wherein said relations work in a 2 way direction, and wherein said datasets and graphic charts are accordingly updated when manipulated, and wherein said mathematical model is a matrix model, comprising singular variable expressions.

14. A database server for visualizing graphic charts to one or more users using a computing device connected to the server via a network, the server comprising at least one processor, the at least one processor configured to:
  create n variables, wherein n is three or more;
  create multiple different datasets, comprising data points representing a relation between a subset of said variables;
  create one or more graphic charts each comprising a representation of one or more of said datasets;
  display, via a graphical user interface, said graphic charts on one or more display elements; and
  receive a result of manipulating, via a graphical user interface, a dataset in a graphic chart,
  characterized in, that wherein a mathematical model is created, wherein said relations between said datasets are determined by said mathematical model, wherein said relations work in a 2 way direction, and wherein said datasets and graphic charts are accordingly updated when manipulated, and wherein said mathematical model is a matrix model, comprising singular variable expressions.

* * * * *